(12) United States Patent
Chen et al.

(10) Patent No.: US 11,200,364 B2
(45) Date of Patent: Dec. 14, 2021

(54) METHOD AND ASSOCIATED SYSTEM FOR CIRCUIT DESIGN

(71) Applicant: TAIWAN SEMICONDUCTOR MANUFACTURING COMPANY LTD., Hsinchu (TW)

(72) Inventors: Chia Cheng Chen, Hsinchu (TW); Ching-Fang Chen, Taichung (TW); Huang-Yu Chen, Hsinchu County (TW); Jen Ping Hsu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 107 days.

(21) Appl. No.: 16/583,218

(22) Filed: Sep. 25, 2019

(65) Prior Publication Data

US 2021/0089630 A1 Mar. 25, 2021

(51) Int. Cl.
*G06F 9/455* (2018.01)
*G06F 30/398* (2020.01)

(52) U.S. Cl.
CPC .................. *G06F 30/398* (2020.01)

(58) Field of Classification Search
USPC ................. 716/110, 111, 112, 118
See application file for complete search history.

(56) References Cited

U.S. PATENT DOCUMENTS

| | | | | |
|---|---|---|---|---|
| 6,976,233 | B1* | 12/2005 | Frank | G06F 30/367 716/112 |
| 6,983,434 | B1* | 1/2006 | Frank | G06F 30/367 716/112 |
| 2005/0237776 | A1* | 10/2005 | Gropper | H05K 3/0005 365/1 |
| 2005/0246670 | A1* | 11/2005 | Bois | G06F 30/367 716/112 |
| 2006/0225017 | A1* | 10/2006 | Uchida | G06F 30/398 716/112 |
| 2011/0239178 | A1* | 9/2011 | Yamashita | G06F 30/394 716/122 |
| 2012/0272203 | A1* | 10/2012 | Hawk | G06F 30/394 716/130 |
| 2013/0305194 | A1* | 11/2013 | Wang | G06F 30/398 716/52 |

* cited by examiner

*Primary Examiner* — Brian Ngo
(74) *Attorney, Agent, or Firm* — WPAT, P.C., Intellectual Property Attorneys; Anthony King

(57) ABSTRACT

A method, includes: extracting a design data using a computer, wherein the design data includes a net name and a connective layer name of each layout design in each cell; generating a layout pattern corresponding to the design data by assigning an ID to said each layout design, wherein the ID includes a first indicator indicative of the net name and a second indicator indicative of the connective layer name; and checking the layout pattern to locate an error of the layout pattern.

20 Claims, 23 Drawing Sheets

METHOD AND ASSOCIATED SYSTEM FOR CIRCUIT DESIGN

BACKGROUND

Layout Versus Schematic (LVS) is a tool utilized to check if a layout matches a design. By running the LVS, if there is an error such as a short circuit violation, the whole short circuit pattern is highlighted as a violation path. With such configurations, it may be hard to determine a precise short circuit location.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
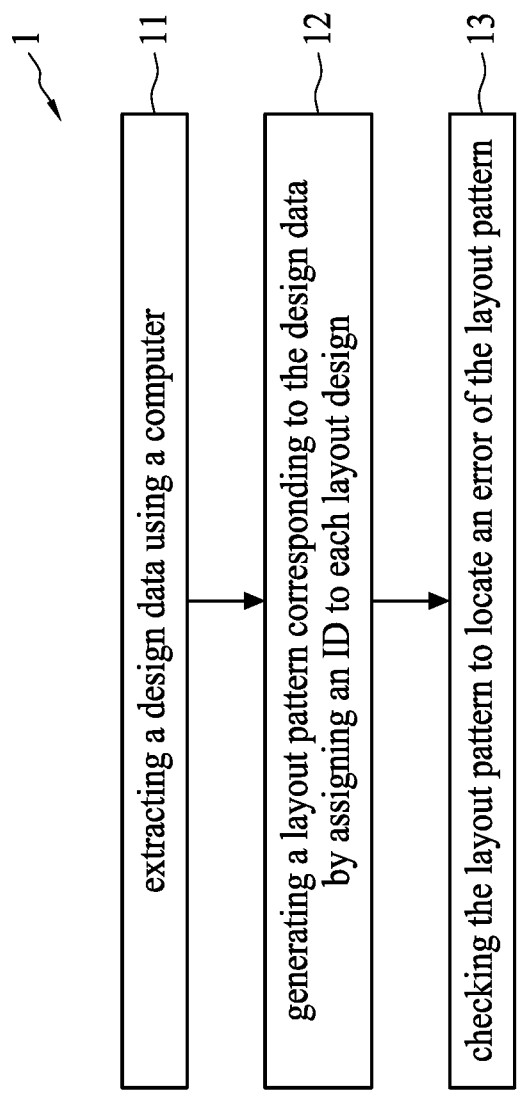
FIG. 1 is a flowchart illustrating a method according to an embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Conventionally, Layout Versus Schematic (LVS) has been utilized to check if a layout matches a design. If not matched, one of the main reasons is the short circuit violation. By running LVS, if there is a short circuit violation, the whole short circuit pattern is highlighted as a violation path. With such configurations, it is hard to locate the short circuit location precisely and exactly. In order to locate the short circuit location precisely and exactly, this disclosure proposes a method and associated system to facilitate the process of locating short circuit locations. With the method and the associated system proposed by this disclosure, the operation time of correcting short circuit errors is effectively reduced.

FIG. 1 is a flowchart illustrating a method 1 according to an embodiment of the present disclosure. Provided that the results are substantially the same, the operations shown in FIG. 1 are not required to be executed in the exact order. The method 1 is summarized as follows.

Operation 11: a design data is extracted using a computer.

Operation 12: a layout pattern corresponding to the design data is generated by assigning an identity (ID) to said each layout design.

Operation 13: the layout pattern is checked to locate, if any, an error of the layout pattern.

In operation 11, the design data includes physical information of each cell. Specifically, the design data includes a net name and a connective layer name of each layout design in each cell. In some embodiments, the design data is stored in a database. In some embodiments, the design data is a Design Exchange Format (DEF) file or a Library Exchange Format (LEF) file. The DEF file contains the placement information of macros, standard cells, input/output pins and other physical entities. The LEF file is the abstract view of cells. However, the type of the design data should not be a limitation of the present disclosure. Those skilled in the art should readily understand that the design data may include other physical information of each cell. For example, the design data further includes the location and the dimension of each layout design in each cell.

Figure 2:
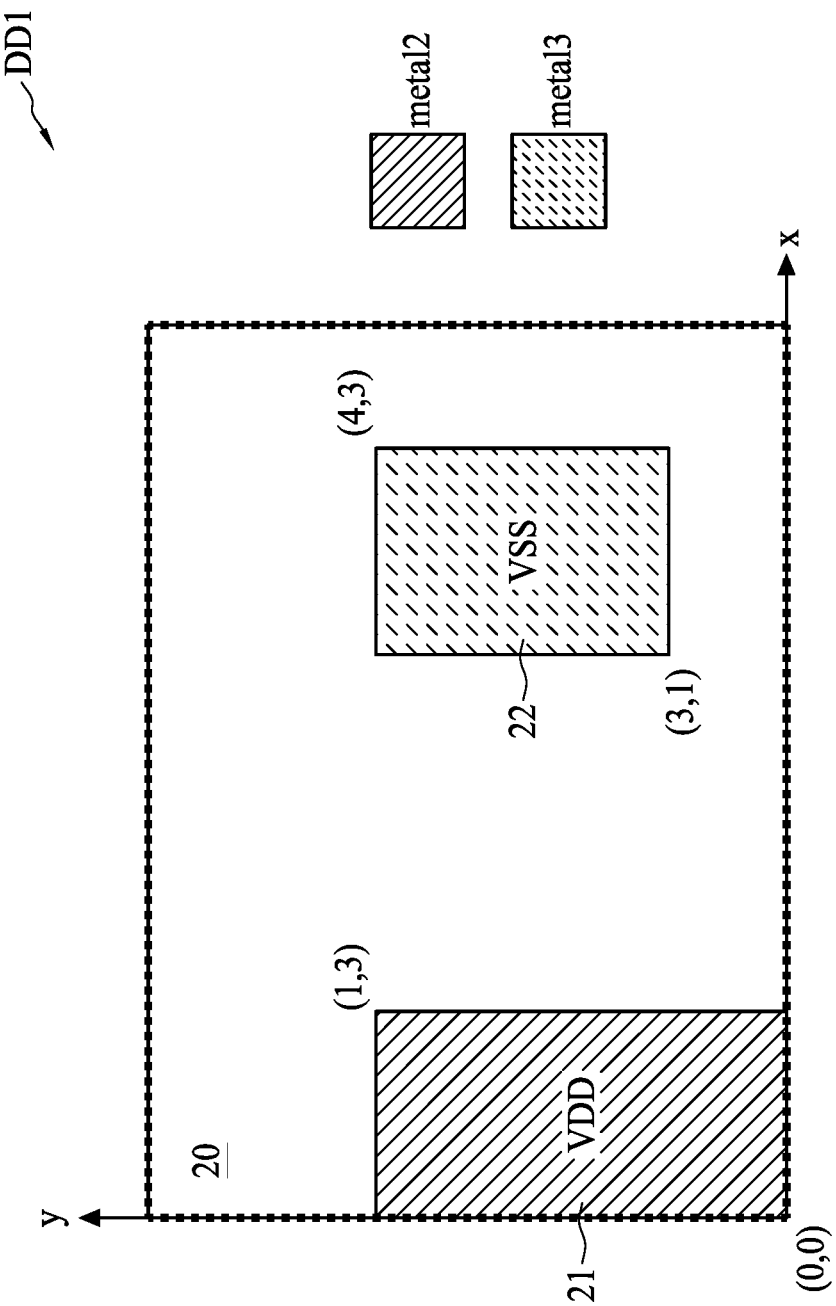
FIG. 2 is a diagram illustrating a design data according to an embodiment of the present disclosure.

FIG. 2 is a diagram illustrating a design data DD1 according to an embodiment of the present disclosure. In this embodiment, the design data DD1 includes physical information of a Cell 20, wherein the Cell 20 includes layout designs 21 and 22. The layout design 21 corresponds to a net name VDD while the layout design 22 corresponds to a net name VSS. Further, the layout design 21 is designed by using a layer of metal2, and thus the layout design 21 corresponds to a connective layer name indicative of metal2. On the other hand, the layout design 22 is also designed by using a layer of metal3, and thus the layout design 21 also corresponds to a connective layer name indicative of metal3. In addition, the layout design 21 expands from (0,0) to (1,3) while the layout design 22 expands from (3,1) to (4,3). Accordingly, the physical information such as the net names, the connective layer names and the locations of the layout designs 21 and 22 in the cell 20 are included in the design data DD1.

Figure 3:
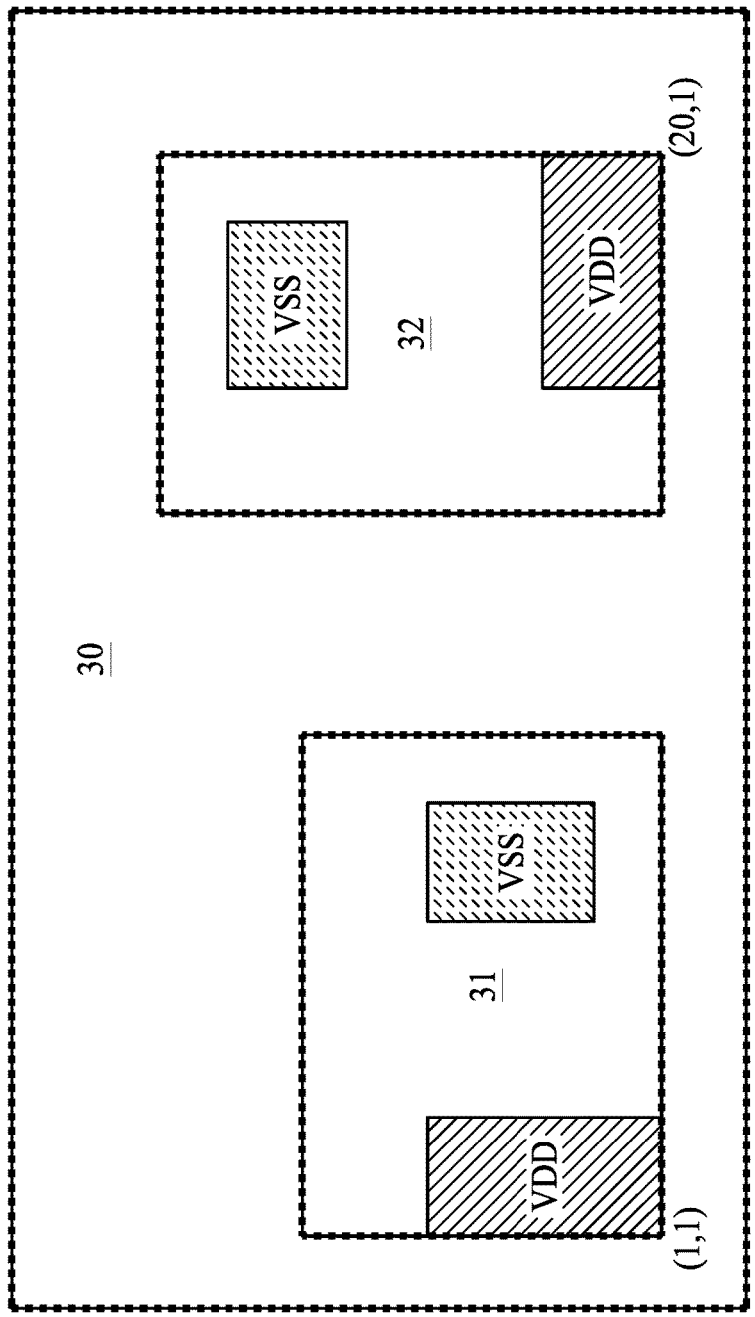
FIG. 3 is a diagram illustrating a design data according to another embodiment of the present disclosure.
Figure 3:
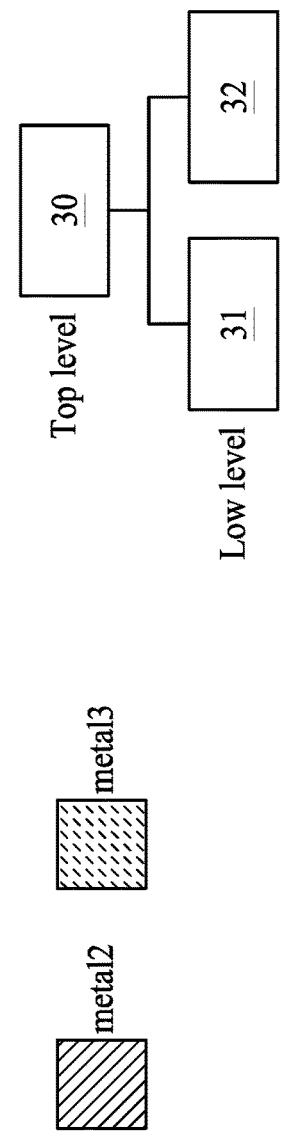

FIG. 3 is a diagram illustrating a design data DD2 according to an embodiment of the present disclosure. In this embodiment, the design data DD2 includes physical information of a cell 30. The cell 30 includes two sub-Cells 31 and 32. Hierarchically, the cell 30 is a top-level cell and the sub-cells 31 and 32 are low-level cells. The sub-cells 31 and 32 are similar to the cell 20 described in FIG. 2 except that the sub-cell 32 is rotated 270 degrees clockwise, as shown in FIG. 3. Similarly, the design data DD2 includes the physical information such as the net names, the connective layer names, the locations and the rotate angle of each layout design in the sub-cells 31 and 32.

Back to FIG. 1, in operation 12, a layout pattern corresponding to the design data is generated by assigning an ID to each layout design. The ID includes a first indicator indicative of the net name and a second indicator indicative of the connective layer name. In some embodiments, the layout pattern is a graphic data system (GDS) file, which is readable for a design rule check (DRC) tool. However, the type of the layout pattern should not be a limitation of the present disclosure.

Figure 4:
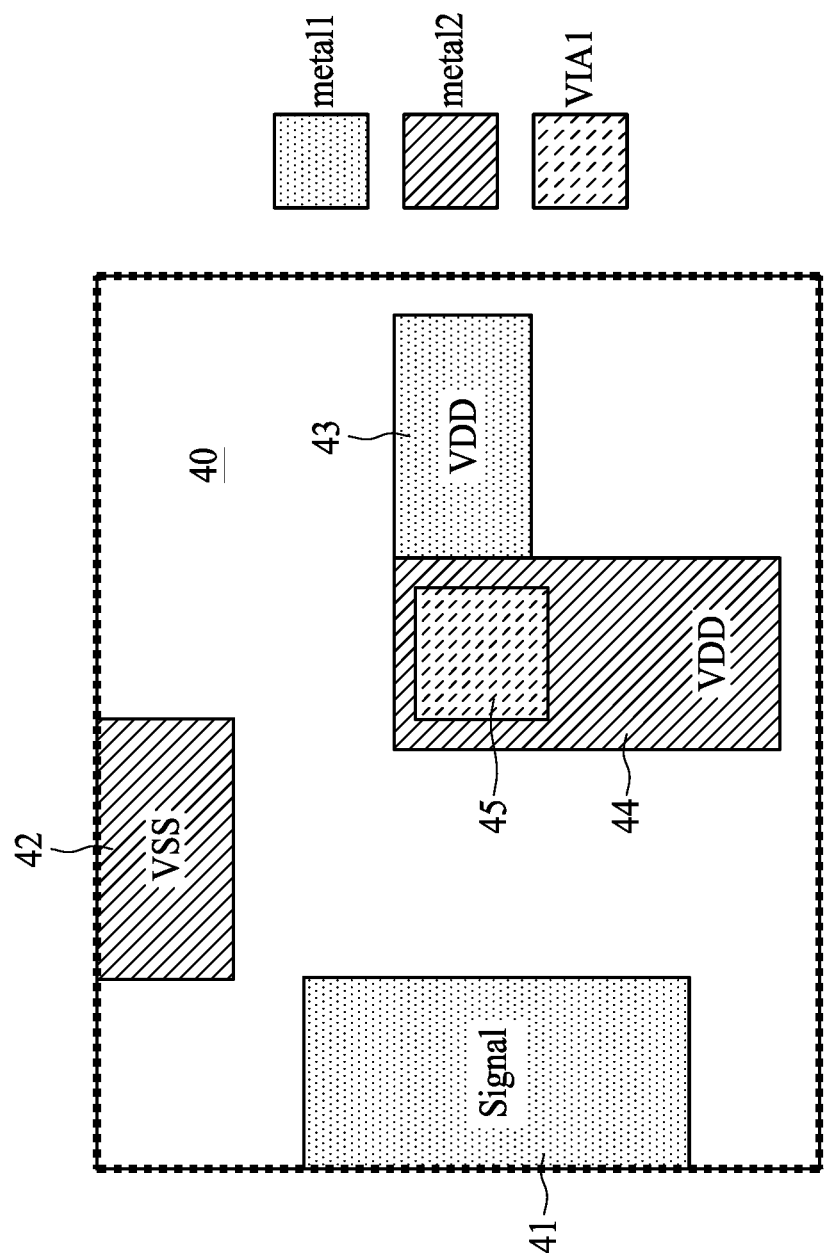
FIG. 4 is a diagram illustrating a layout pattern of a cell according to an embodiment of the present disclosure.

FIG. 4 is a diagram illustrating a layout pattern of a cell 40 according to an embodiment of the present disclosure. The cell 40 includes layout designs 41, 42, 43, 44 and 45. The layout design 41 corresponds to a net name Signal and a connective layer name of metal1. The layout design 42 corresponds to a net name VSS and a connective layer name of metal2. The layout design 43 corresponds to a net name VDD and a connective layer name of metal1. The layout design 44 corresponds to the net name VDD and the connective layer name of metal2. The layout design 45 corresponds to the net name VDD and a connective layer name of VIA1 According to the net names and the connective layer names of each layout design in the layout pattern of the cell 40, an ID is assigned to each layout design in the layout pattern of the cell 40. The operation of assigning an ID to each layout design will be described in the following paragraphs.

Figure 5A:
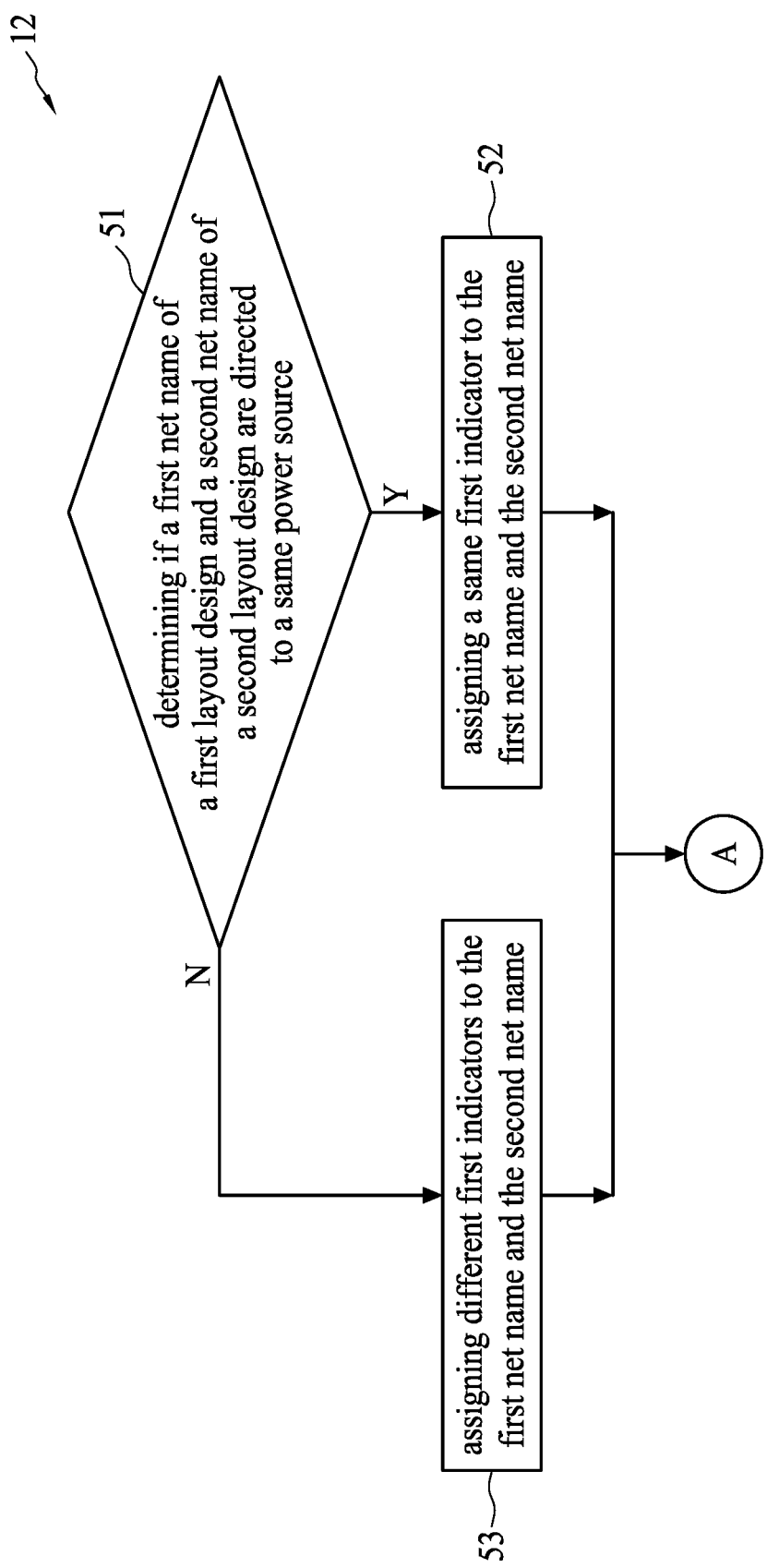
FIG. 5A is a flowchart illustrating a first part of an operation shown in FIG. 1 according to an embodiment of the present disclosure.

FIG. 5A is a flowchart illustrating a first part of the operation 12 according to an embodiment of the present disclosure. Provided that the results are substantially the same, the operations shown in FIG. 5A are not required to be executed in the exact order. The first part of the operation 12 is summarized as follows.

Operation 51: it is determined if a first net name of a first layout design and a second net name of a second layout design are directed to a same power source; if affirmative, go to operation 52; otherwise, go to operation 53.

Operation 52: a same first indicator is assigned to the first net name and the second net name.

Figure 5B:
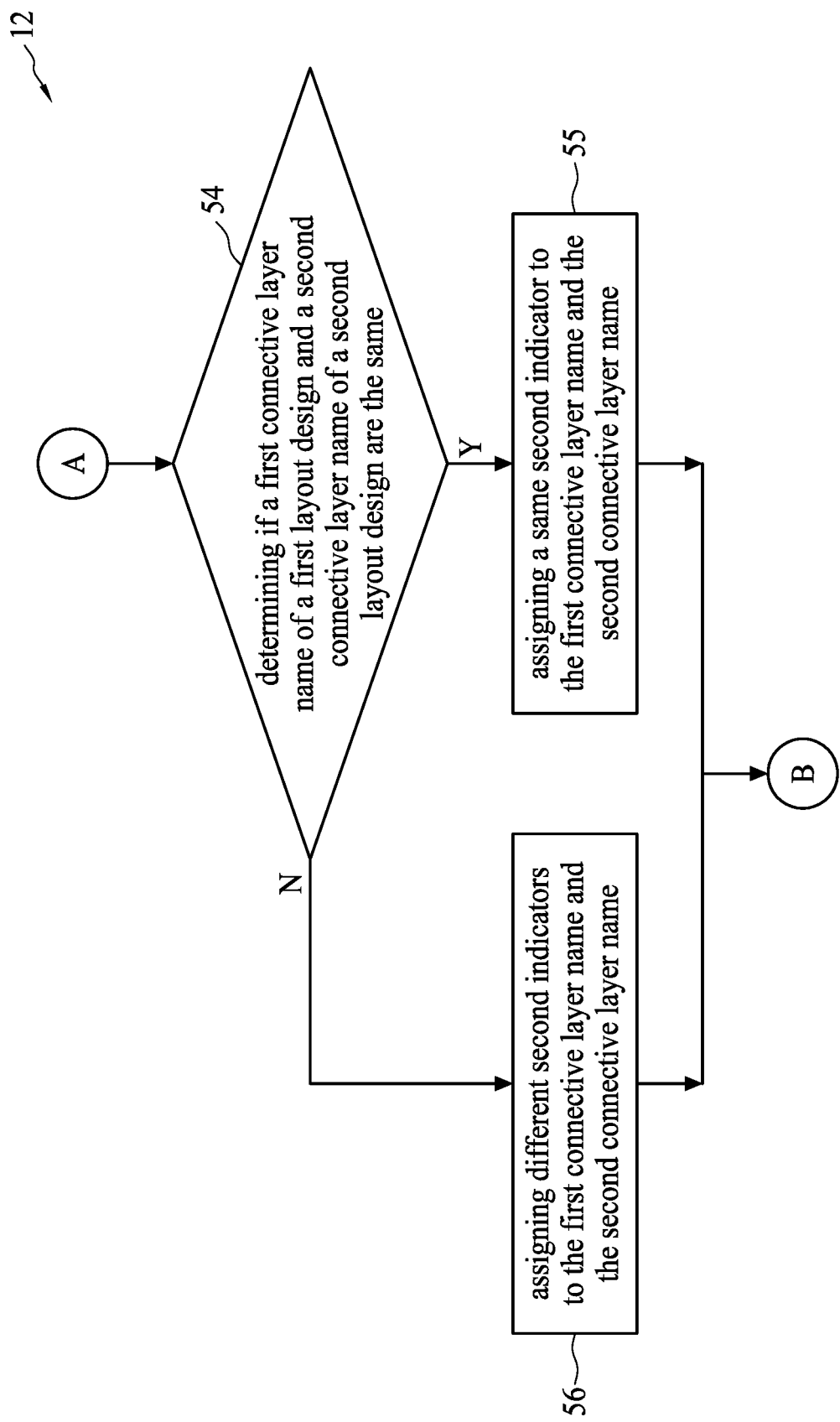
FIG. 5B is a flowchart illustrating a second part of an operation shown in FIG. 1 according to an embodiment of the present disclosure.

Operation 53: different first indicators are assigned to the first net name and the second net name, and the flow proceeds on FIG. 5B.

To elaborate the operations 51 to 53, please refer to FIG. 4 again. In FIG. 4, the layout design 41 and the layout design 42 correspond to different net names. Specifically, the layout design 41 corresponds to the net name Signal while the layout design 42 corresponds to the net name VSS. The net name Signal and the net name VSS are directed to different power source. Therefore, different first indicators are assigned to the layout designs 41 and 42. For example, a first indicator [1] indicative of the net name Signal is assigned to the layout design 41, and a first indicator [2] indicative of the net name VSS is assigned to the layout design 42.

On the other hand, the layout designs 43, 44 and 45 correspond to the net name VDD, that is, the net names of the layout designs 43, 44 and 45 are directed to the same power source. Therefore, a same first indicator is assigned to the layout designs 43, 44 and 45. For example, a first indicator [3] indicative of the net name VDD is assigned to the layout designs 43, 44 and 45.

It should be noted that, the number of the first indicator assigned to each layout design is only for illustrative purpose, it should not be a limitation of the present disclosure.

Figure 6:
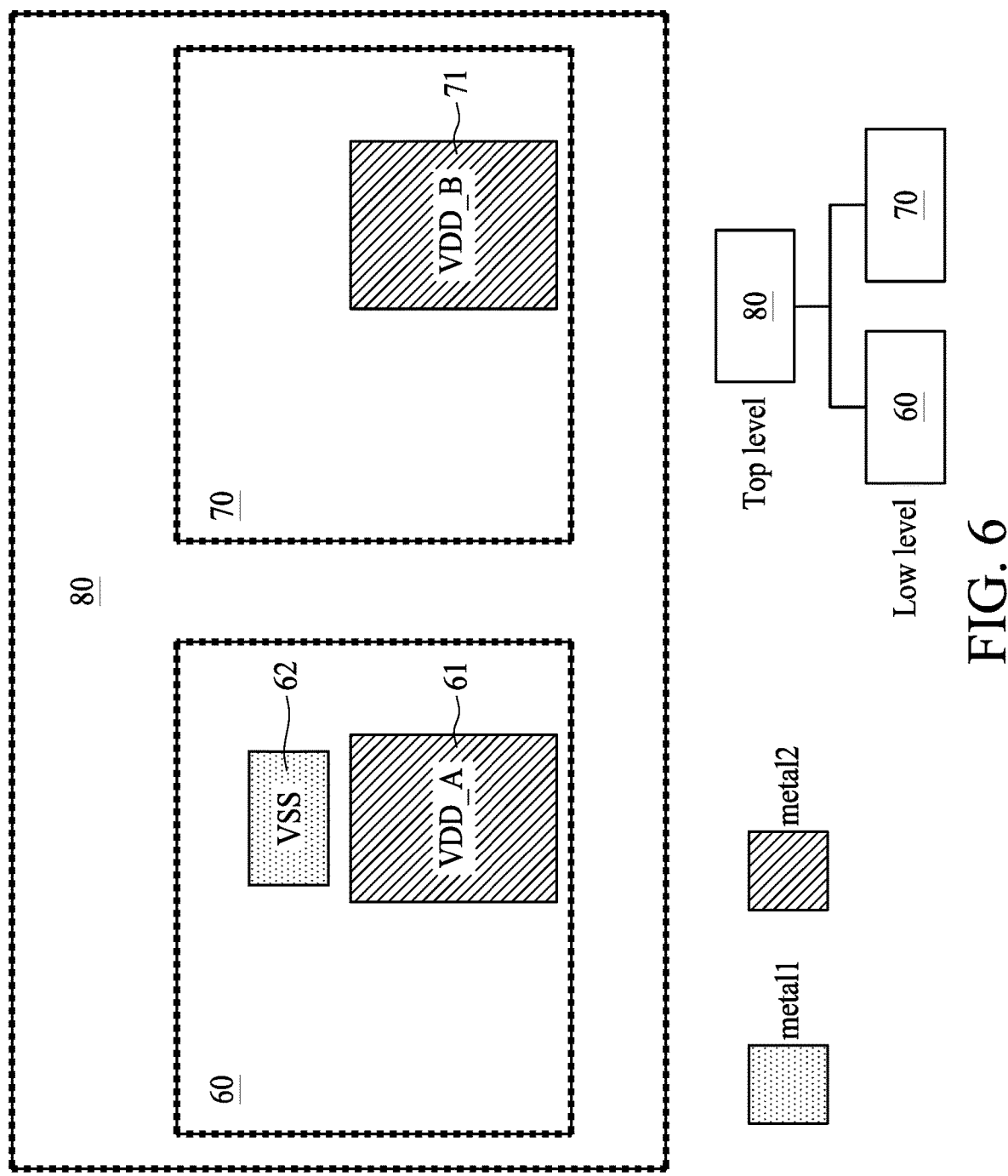
FIG. 6 is a diagram illustrating a cell according to an embodiment of the present disclosure.

To further elaborate the operations 51 to 53, please refer to FIG. 6. FIG. 6 is a diagram illustrating a cell 80 according to an embodiment of the present disclosure. The cell 80 includes two sub-cells 60 and 70, and the cell 80 is a top-level cell while the sub-cells 60 and 70 are low-level cells. The sub-cell 60 includes layout designs 61 and 62. The layout design 61 corresponds to a net name VDD_A, and the layout design 62 corresponds to a net name VSS. The sub-cell 70 includes a layout design 71. The layout design 71 corresponds to a net name VDD_B. The net name VSS and the net name VDD_A are directed to different power sources. Therefore, different first indicators are assigned to the layout designs 61 and 62. For example, a first indicator [2] indicative of the net name VSS is assigned to the layout design 62, and a first indicator [3] indicative of the net name VDD_A is assigned to the layout design 61.

On the other hand, the layout designs 61 and 71 correspond to different net names VDD_A and VDD_B. However, the net names VDD_A and VDD_B are directed to the same power source. Therefore, a same first indicator is assigned to the layout designs 61 and 71. For example, the first indicator [3] indicative of the net name VDD is assigned to the layout designs 61 and 71.

It should be noted that, the number of the first indicator assigned to each layout design is only for illustrative purpose, it should not be a limitation of the present disclosure.

FIG. 5B is a flowchart illustrating a second part of the operation 12 according to an embodiment of the present disclosure. Provided that the results are substantially the same, the operations shown in FIG. 5B are not required to be executed in the exact order. The second part of the operation 12 is summarized as follows.

Operation 54: it is determined if a first connective layer name of a first layout design and a second connective layer name of a second layout design are the same; if affirmative, go to operation 55; otherwise, go to operation 56.

Operation 55: a same second indicator is assigned to the first connective layer name and the second connective layer name.

Figure 5C:
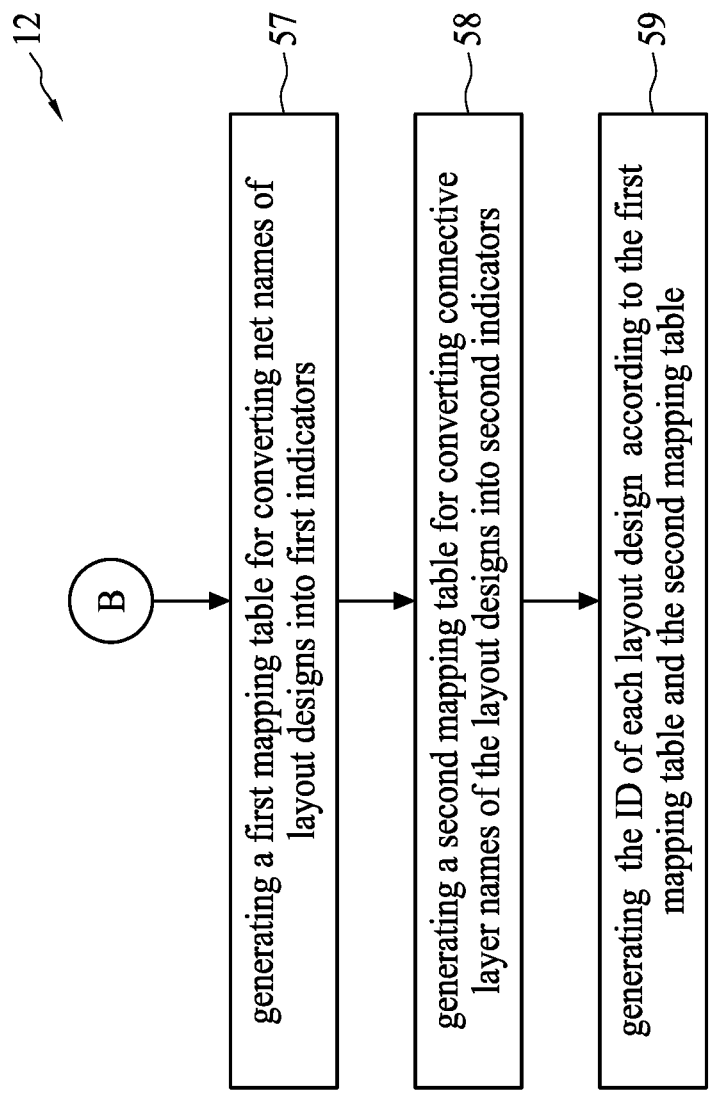
FIG. 5C is a flowchart illustrating a third part of an operation shown in FIG. 1 according to an embodiment of the present disclosure.

Operation 56: different second indicators are assigned to the first connective layer name and the second connective layer name, and the flow proceeds on FIG. 5C.

To elaborate the operations 54 to 56, please refer to FIG. 4 again. In FIG. 4, the layout design 41 and the layout design 42 correspond to different connective layer names. Specifically, the layout design 41 corresponds to the connective layer name of metal1 while the layout design 42 corresponds to the connective layer name of metal2. Therefore, different second indicators are assigned to the layout designs 41 and 42. For example, a second indicator [1] indicative of the connective layer name of metal1 is assigned to the layout design 41, and a second indicator [2] indicative of the connective layer name of metal2 is assigned to the layout design 42.

On the other hand, the layout designs 42 and 44 both correspond to the connective layer name of metal2. Therefore, a same second indicator is assigned to the layout designs 42 and 44. For example, a second indicator [2] indicative of the connective layer name of metal2 is assigned to the layout designs 42 and 44. In addition, the layout design 45 corresponds to a connective layer name of VIA1, which means that the layout design 45 includes a contact via for connecting the connective layer metal1 and the connective layer metal2. In this present disclosure, a second indicator [1/2] is assigned to the layout design 45, wherein the second indicator [1/2] is regarded as a second indicator [1] or a second indicator [2].

FIG. 5C is a flowchart illustrating a third part of the operation 12 according to an embodiment of the present disclosure. Provided that the results are substantially the same, the operations shown in FIG. 5C are not required to be executed in the exact order. The third part of the operation 12 is summarized as follows.

Operation 57: A first mapping table for converting net names of layout designs into first indicators is generated.

Operation 58: A second mapping table for converting connective layer names of the layout designs into second indicators is generated.

Operation 59: The ID of each layout design is generated according to the first mapping table and the second mapping table.

To elaborate the operation 57, please refer to FIG. 4 in conjunction with table 1 below. Table 1 shows the first mapping table according to the layout pattern of the cell 40.

TABLE 1

| Layout designs | Net names | First indicators |
| --- | --- | --- |
| 41 | Signal | 1 |
| 42 | VSS | 2 |
| 43 | VDD | 3 |
| 44 | VDD | 3 |
| 45 | VDD | 3 |

As mentioned in the embodiment of FIG. 4, the layout design 41 corresponds to the net name Signal, the layout design 42 corresponds to the net name VSS, and the layout designs 43 to 45 correspond to the net name VDD. Therefore, a first indicator [1] indicative of the net name Signal is assigned to the layout design 41, a first indicator [2] indicative of the net name VSS is assigned to the layout design 42, and a first indicator [3] indicative of the net name VDD is assigned to the layout designs 43, 44 and 45. Accordingly, table 1 is generated.

To elaborate the operation 52, please refer to FIG. 4 in conjunction with table 2 below. Table 2 shows the second mapping table according to the layout pattern of the cell 40.

TABLE 2

| Layout designs | Connective layer names | second indicators |
| --- | --- | --- |
| 41 | Metal1 | 1 |
| 42 | Metal2 | 2 |
| 43 | Metal1 | 1 |
| 44 | Metal2 | 2 |
| 45 | VIA1 | ½ |

As mentioned above, the layout designs 41 and 43 correspond to the connective layer name of metal1, and the layout designs 42 and 44 correspond to the connective layer name of metal2. The layout design 45 corresponds to the connective layer name of VIA1, which means that the layout design 45 includes a contact via for connecting the connective layer metal1 and the connective layer metal2. Therefore, a second indicator [1] indicative of the connective layer name of metal1 is assigned to the layout designs 41 and 43, a second indicator [2] indicative of the connective layer name of metal2 is assigned to the layout designs 42 and 44, and a second indicator [1/2] indicative of the connective layer name of VIA1 is assigned to the layout design 45. The second indicator [1/2] is regarded as the second indicator [1] or the second indicator [2]. Accordingly, table 2 is generated.

To elaborate the operation 53, please refer to table 1 and table 2 in conjunction with table 3 shown below. In table 3, an ID [1,1] is assigned to the layout design 41 because the first indicator and the second indicator of the layout design 41 are [1]. Further, an ID [2,2] is assigned to the layout design 42 because the first indicator and the second indicator of the layout design 42 are [2]. Furthermore, an ID [3,1] is assigned to the layout design 43 because the first indicator of the layout design 43 is [3] while the second indicator of the layout design 43 is [1]. In addition, an ID [3,2] is assigned to the layout design 44 because the first indicator of the layout design 44 is [3] while the second indicator of the layout design 44 is [2]. Likewise, an ID [3,1/2] is assigned to the layout design 45 because the first indicator of the layout design 45 is [3] while the second indicator of the layout design 45 is [1/2].

TABLE 3

| Layout designs | IDs |
| --- | --- |
| 41 | [1, 1] |
| 42 | [2, 2] |
| 43 | [3, 1] |
| 44 | [3, 2] |
| 45 | [3, ½] |

It should be noted that, the numbers of the first indicator and the second indicator assigned to each layout design are only for illustrative purpose, it should not be a limitation of the present disclosure.

Figure 7:
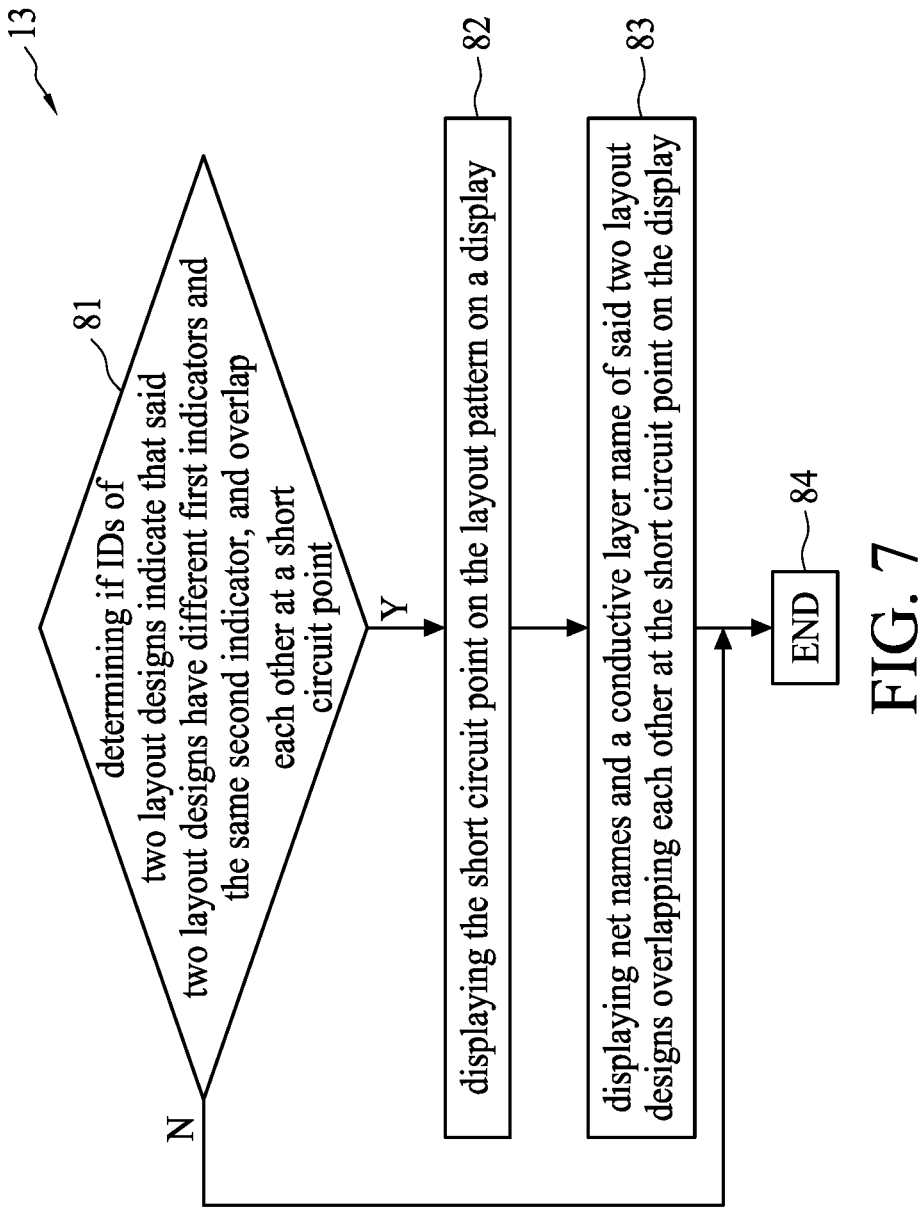
FIG. 7 is a flowchart illustrating an operation shown in FIG. 1 according to an embodiment of the present disclosure.

FIG. 7 is a flowchart illustrating the operation 13 in FIG. 1 according to an embodiment of the present disclosure. Provided that the results are substantially the same, the operations shown in FIG. 7 are not required to be executed in exact order. In this present disclosure, the operation 13 can be executed by performing DRC upon the layout pattern via a DRC tool to locate the error of the layout pattern. The operation 13 is summarized as follows.

Operation 81: it is determined if IDs of two layout designs indicate that said two layout designs have different first indicators and the same second indicator, and overlap each other at a short circuit point.

Operation 82: the short circuit point is displayed on the layout pattern on a display.

Operation 83: net names and a conductive layer name of said two layout designs overlapping each other at the short circuit point are displayed on the display.

Figure 8:
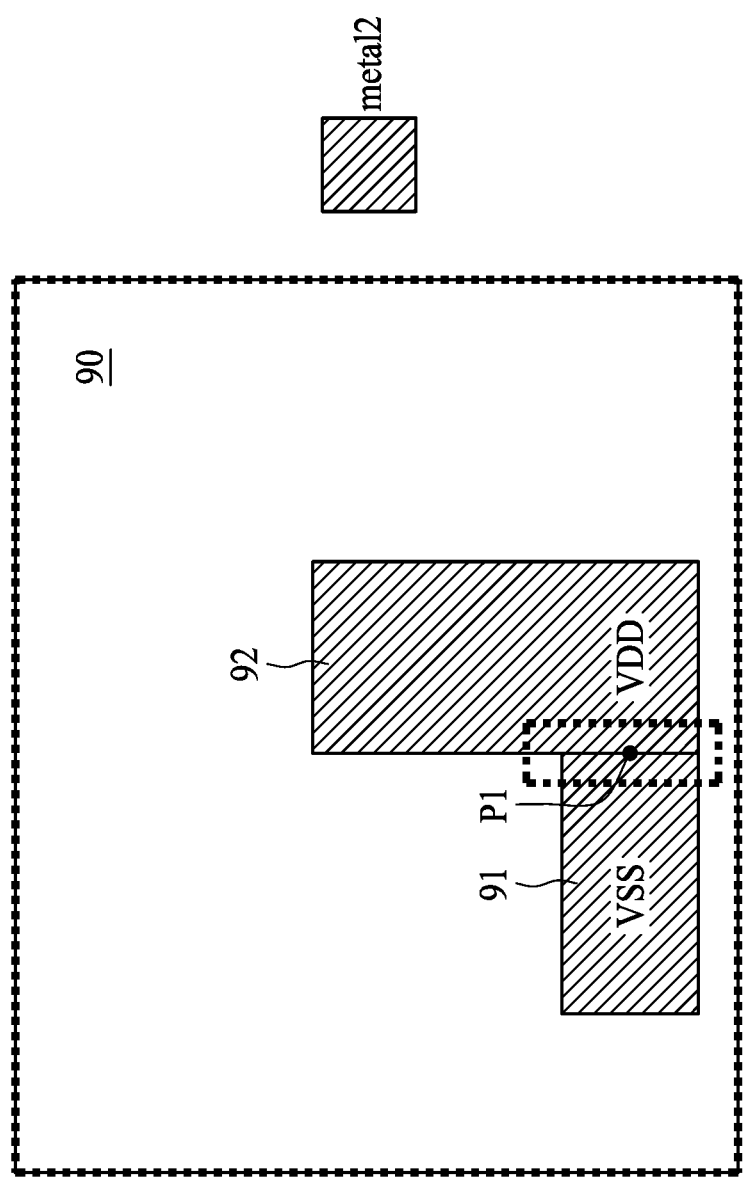
FIG. 8 is a diagram illustrating a cell according to an embodiment of the present disclosure.

To elaborate the operations 81 to 83, please refer to FIG. 8. FIG. 8 is a diagram illustrating a cell 90 according to an embodiment of the present disclosure. In FIG. 8, the layout pattern of the cell 90 includes layout designs 91 and 92. The layout design 91 corresponds to a net name VSS and a connective layer name of metal2. The layout design 92 corresponds to a net name VDD and a connective layer name of metal2. According to the embodiments of FIG. 5A to 5C, an ID is assigned to the layout design 91. For example, the ID [2, 2] is assigned to the layout design 91. Likewise, the ID [3, 2] is assigned to the layout design 92. The IDs of the layout designs 91 and 92 indicate that the layout designs 91 and 92 have different first indicators (i.e., [2] and [3], respectively) and the same second indicator (i.e., [2]). Moreover, the layout designs 91 and 92 overlap each other, wherein the overlap includes a short circuit point P1, which is a layout error. Therefore, according to the embodiment of FIG. 7, the short circuit point P1 is displayed on a display for the user to eliminate the short circuit error. In addition, the net names VSS and VDD and the connective layer name of metal2 are both shown on the display to facilitate the elimination of the short circuit error.

Figure 9:
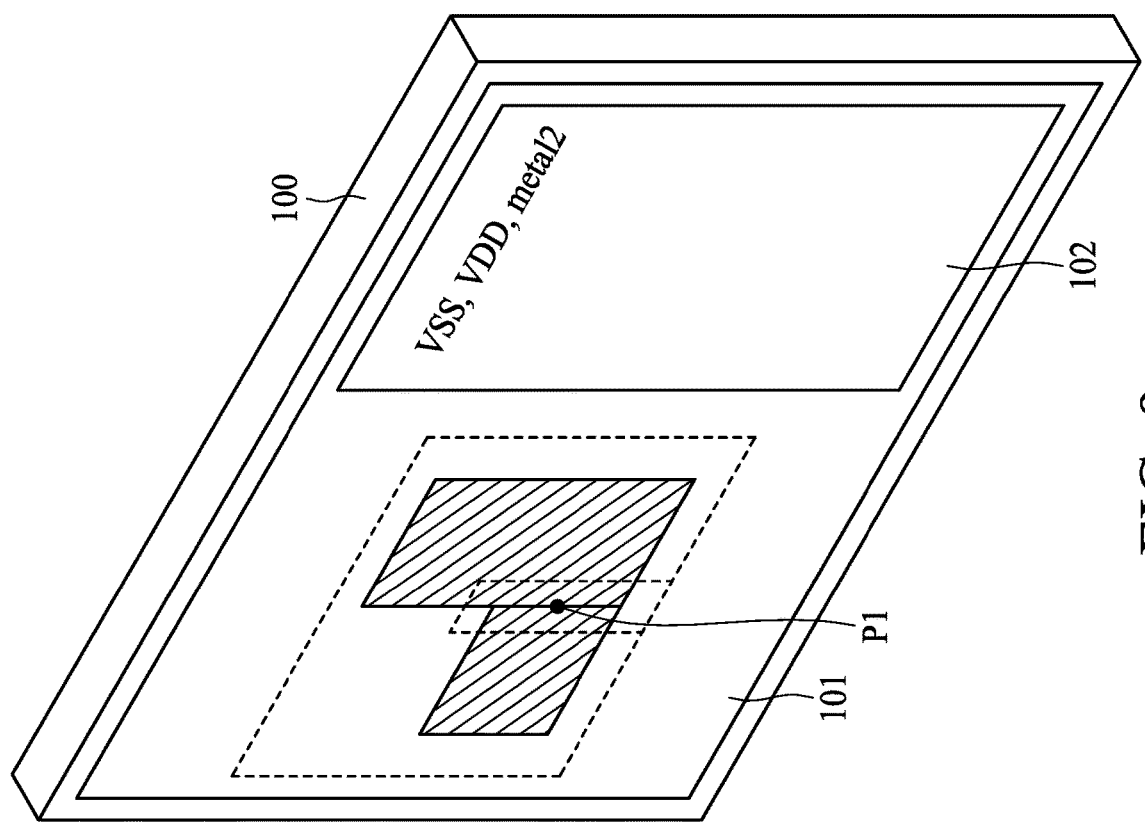
FIG. 9 is a diagram illustrating a display showing a short circuit point according to an embodiment of the present disclosure.

FIG. 9 is a diagram illustrating a display 100 showing the short circuit point P1 according to an embodiment of the present disclosure. Based on the embodiment of FIG. 8, the IDs of the layout designs 91 and 92 indicate that the layout designs 91 and 92 have different first indicators and the same second indicator, and the layout designs 91 and 92 overlap each other, wherein the overlap includes the short circuit point P1. As a result, after checking the layout pattern of the cell 90, for example, performing DRC upon the layout pattern of the cell 90, the short circuit point P1 is shown on a part 101 of the display 100, and the net names VSS and VDD and the connective layer name of metal2 are shown on a part 102 of the display 100. With such configurations, the user can easily eliminate the short circuit error, and the operation time of correcting short circuit errors is effectively reduced.

Figure 10:
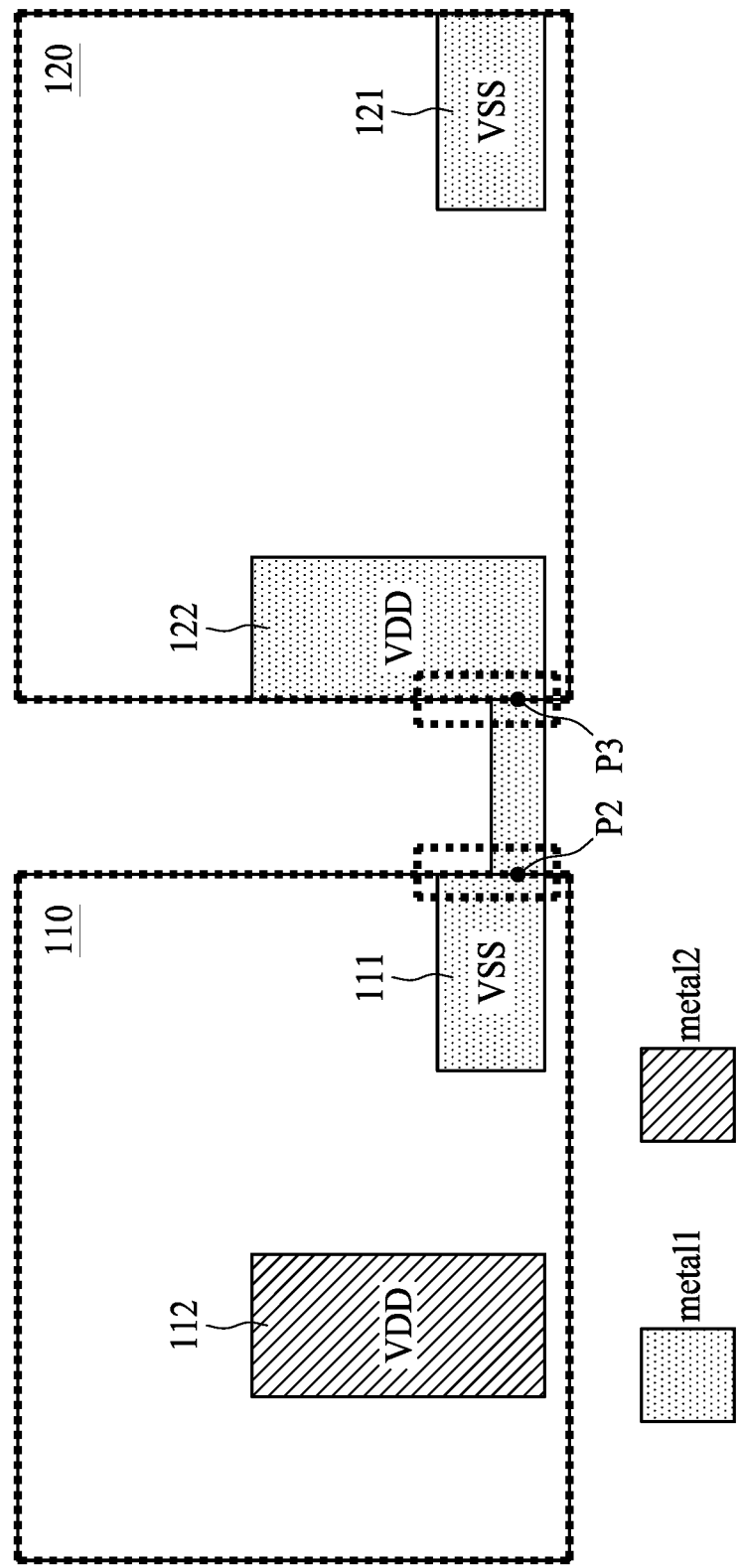
FIG. 10 is a diagram illustrating a cell and another cell according to an embodiment of the present disclosure.

FIG. 10 is a diagram illustrating a cell 110 and a cell 120 according to an embodiment of the present disclosure. The layout pattern of the cell 110 includes layout designs 111 and 112. The layout design 111 corresponds to a net name VSS and a connective layer name of metal1. The layout design 112 corresponds to a net name VDD and a connective layer name of metal2. According to the embodiments of FIG. 5A to 5C, an ID is assigned to the layout design 111. For example, the ID [2, 1] is assigned to the layout design 111. Likewise, the ID [3, 2] is assigned to the layout design 112.

On the other hand, the layout pattern of the cell 120 includes layout designs 121 and 122. The layout design 121 corresponds to a net name VSS and a connective layer name metal1, and the layout design 122 corresponds to a net name VDD and a connective layer name of metal1. According to the embodiments of FIG. 5A to 5C, an ID is assigned to the layout design 121. For example, the ID [2, 1] is assigned to the layout design 121. Likewise, the ID [3, 1] is assigned to the layout design 122.

The IDs of the layout designs 111 and 122 indicate that the layout designs 111 and 122 have different first indicators (i.e., [2] and [3], respectively) and the same second indicator (i.e., [1]). Moreover, the layout designs 111 and 122 overlap each other via a connective routing, wherein the overlap includes short circuit points P2 and P3, which is a layout error. Therefore, according to the embodiment of FIG. 7, the short circuit points P2 and P3 are displayed on a display for the user to eliminate the short circuit error. In addition, the net names VSS and VDD and the connective layer name of metal2 are both shown on the display to facilitate the elimination of the short circuit error.

Figure 11:
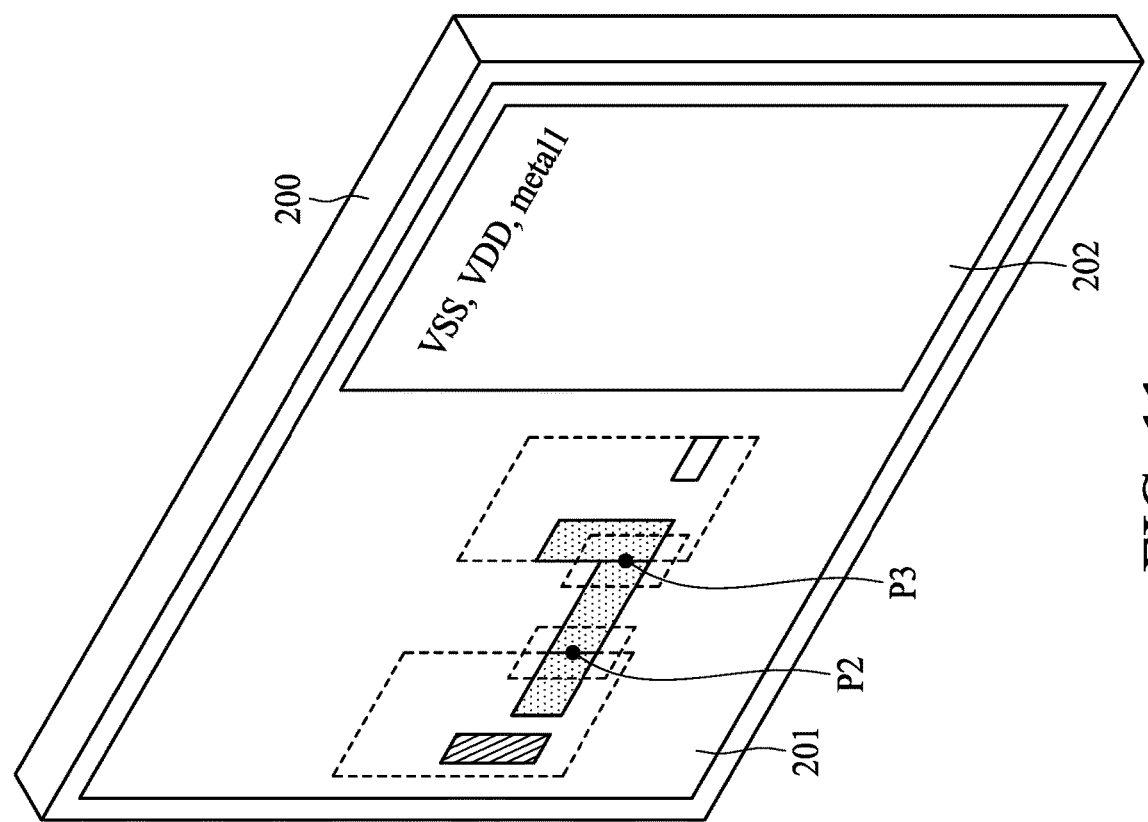
FIG. 11 is a diagram illustrating a display showing short circuit points according to an embodiment of the present disclosure.

FIG. 11 is a diagram illustrating a display 200 showing the short circuit points P2 and P3 according to an embodiment of the present disclosure. Based on the embodiment of FIG. 10, the IDs of the layout designs 111 and 122 indicate that the layout designs 111 and 122 have different first indicators and the same second indicator, and thus the layout designs 111 and 122 overlap each other. The overlap includes the short circuit points P2 and P3. As a result, after checking the layout pattern of the cells 110 and 120 by, for example, performing DRC upon the layout patterns of the cells 110 and 120, the short circuit points P2 and P3 are shown on a part 201 of the display 200, and the net names VSS and VDD and the connective layer name of metal1 are shown on a part 202 of the display 200. With such configurations, the user can easily eliminate the short circuit error, and the operation time of correcting short circuit errors is effectively reduced.

It should be noted that the form of displaying short circuit points in the embodiments of FIGS. 9 and 11 is only for illustrative purpose, and should not be a limitation of the present disclosure. In this present disclosure, the short circuit error can be defined as two layout designs having different first indicators and the same second indicator that overlap each other directly (as shown in FIG. 8) or by a connective routing (as shown in FIG. 10).

Figure 12:
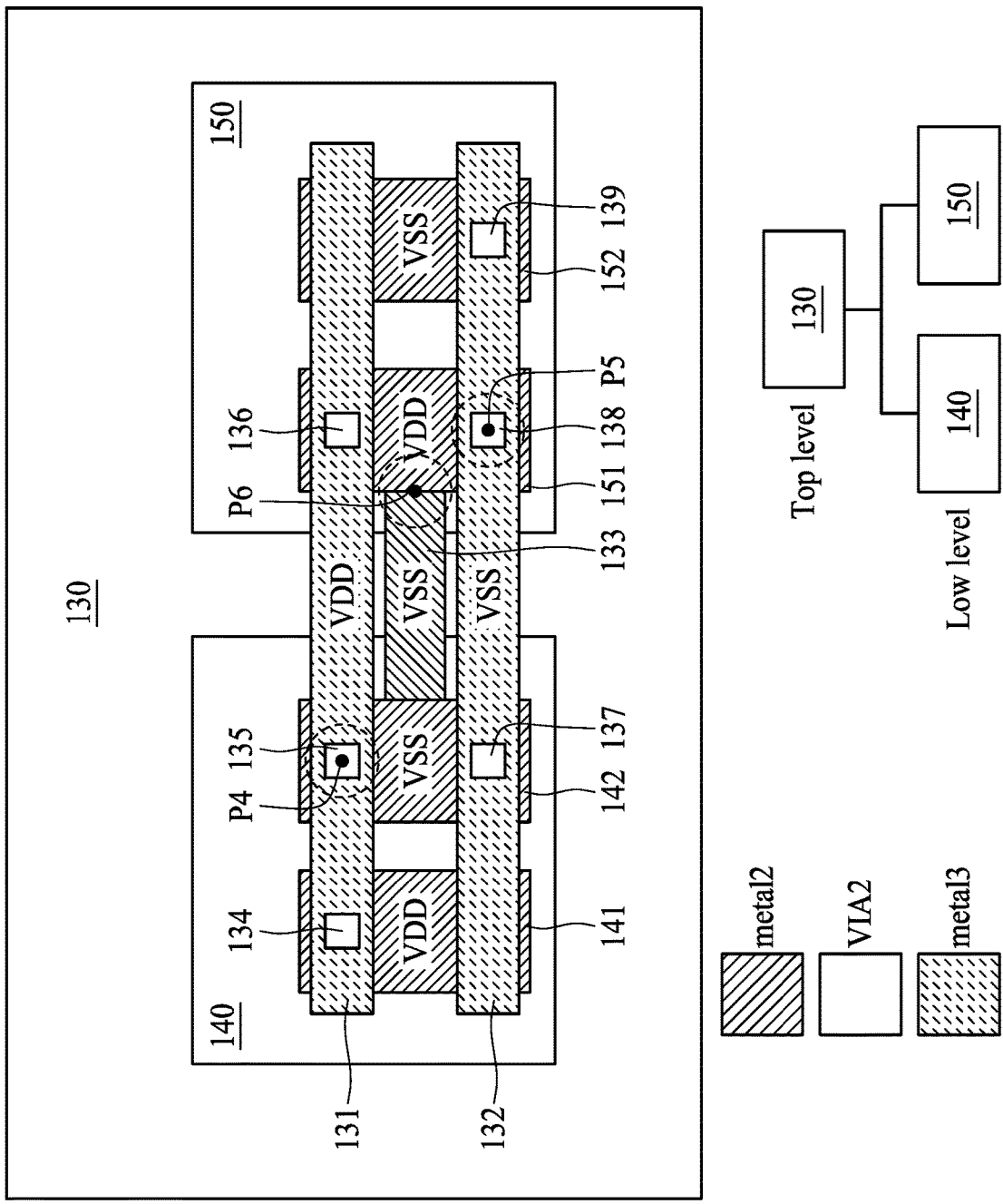
FIG. 12 is a diagram illustrating a cell according to an embodiment of the present disclosure.

FIG. 12 is a diagram illustrating a cell 130 according to an embodiment of the present disclosure. In FIG. 12, a cell 130 includes two sub-cells 140 and 150, and thus the cell 130 is a top-level cell while the sub-cells 140 and 150 are low-level cells. The layout pattern of the cell 130 includes layout designs 131, 132, 133, 134, 135, 136, 137, 138, and 139, wherein the layout designs 131 to 139 are designed in a horizontal direction. The layout design 131 corresponds to a net name VDD and a connective layer name of metal3. The layout designs 132 corresponds to a net name VSS and a connective layer name of metal3. The layout design 133 correspond to a net name VSS and a connective layer name of metal2. The layout designs 134 to 136 correspond to a net name VDD and a connective layer name of VIA2. The layout designs 137 to 139 correspond to a net name VSS and a connective layer name of VIA2. It should be noted that each of the layout designs 134 to 139 include a contact via for connecting the connective layer metal 2 and the connective layer metal3.

According to the embodiment of FIGS. 5A to 5C, an ID is assigned to each of the layout designs 131, 132 and 133. Specifically, an ID [3,4] is assigned to the layout design 131, an ID [2,4] is assigned to the layout design 132, and an ID [2,2] is assigned to the layout design 133. Further, an ID [3,2/3] is assigned to the layout designs 134 to 136, and an ID [2,2/3] is assigned to the layout designs 137 to 139, wherein the second indicator [2/3] is regarded as a second indicator [2] or a second indicator [3].

The layout pattern of the cell 140 includes layout designs 141 and 142, wherein the layout designs 141 and 142 are designed in a vertical direction. The layout design 141 corresponds to a net name VDD and a connective layer name of metal2. The layout designs 142 correspond to a net name VSS and a connective layer name of metal2. According to the embodiments of FIGS. 5A to 5C, an ID is assigned to each of the layout designs 141 and 142. Specifically, an ID [3,2] is assigned to the layout design 141, and an ID [2,2] is assigned to the layout design 132.

The layout pattern of the cell 150 includes layout designs 151 and 152, wherein the layout designs 151 and 152 are designed in a vertical direction. The layout design 151 corresponds to a net name VDD and a connective layer name of metal2. The layout design 152 correspond to a net name VSS and a connective layer name of metal2. According to the embodiment of FIGS. 5A to 5C, an ID is assigned to each of the layout designs 151 and 152. Specifically, an ID [3,2] is assigned to the layout design 151, and an ID [2,2] is assigned to the layout design 152.

The layout design 135 with the ID [3,2/3] and the layout design 142 with the ID [2,2] have different first indicators (i.e., [3] and [2], respectively) and the same second indicator (i.e., the second indicator [2/3] is regarded as the second indicator [2] or the second indicator [3]). Moreover, the layout designs 135 and 142 overlap each other, wherein the overlap includes a short circuit point P4, which is a layout error. Therefore, according to the embodiment of FIG. 7, the short circuit point P4 is displayed on a display for the user to eliminate the short circuit error. In addition, the net names VSS and VDD and the connective layer name of VIA2 are both shown on the display to facilitate the elimination of the short circuit error.

The layout design 138 with the ID [2,2/3] and the layout design 151 with the ID [3,2] have different first indicators (i.e., [2] and [3], respectively) and the same second indicator (i.e., the second indicator [2/3] is regarded as the second indicator [2] or the second indicator [3]). Moreover, the layout designs 138 and 151 overlap each other, wherein the overlap includes a short circuit point P5, which is a layout error. Therefore, according to the embodiment of FIG. 7, the short circuit point P5 is displayed on a display for the user to eliminate the short circuit error. In addition, the net names VSS and VDD and the connective layer name of VIA2 are both shown on the display to facilitate the elimination of the short circuit error.

The layout design 133 with the ID [2,2] and the layout design 151 with the ID [3,2] have different first indicators (i.e., [2] and [3], respectively) and the same second indicator (i.e., [2]). Moreover, the layout designs 133 and 151 overlap each other, wherein the overlap includes a short circuit point P6, which is a layout error. Therefore, according to the embodiment of FIG. 7, the short circuit point P6 is displayed on a display for the user to eliminate the short circuit error. In addition, the net names VSS and VDD and the connective layer name of metal2 are both shown on the display to facilitate the elimination of the short circuit error.

Figure 13:
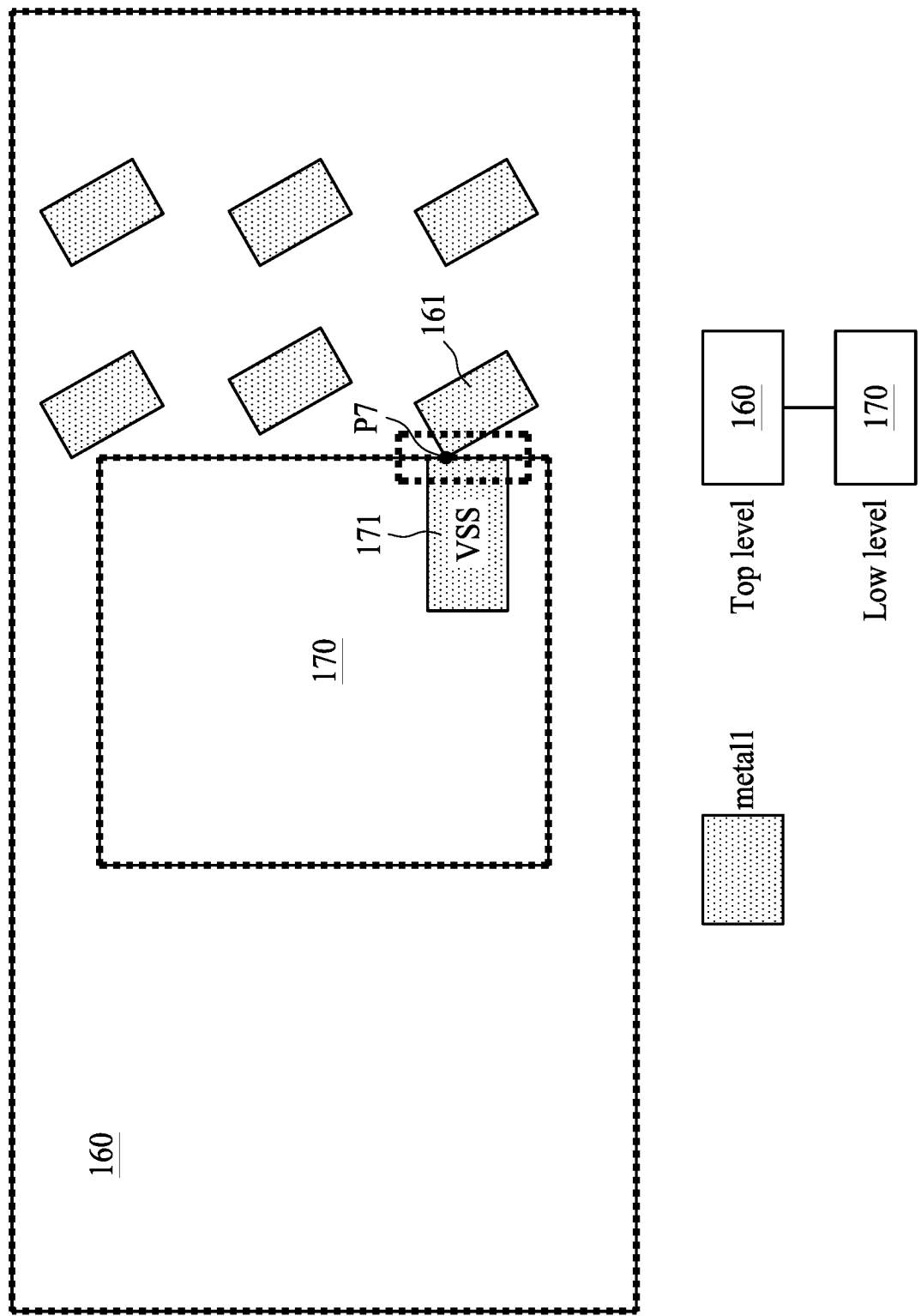
FIG. 13 is a diagram illustrating a cell and another cell according to another embodiment of the present disclosure.

FIG. 13 is a diagram illustrating a cell 160 and a cell 170 according to another embodiment of the present disclosure. The cell 160 includes the cell 170, that is, the cell 160 is a top-level cell and the cell 170 is a low-level cell. The layout pattern of the cell 160 includes a plurality of dummies, for example, the dummy 161. The dummy 161 corresponds to a connective layer name of metal1. The layout pattern of the cell 170 includes a layout design 171, wherein the layout design 171 corresponds to a net name VSS and a connective layer name of metal1. According to the embodiments of FIG. 5A to 5C, an ID is assigned to the dummy 161. For example, the ID [4, 1] is assigned to the dummy 161. Likewise, the ID [2, 1] is assigned to the layout design 171.

The IDs of the dummy 161 and the layout design 171 indicate that the dummy 161 and the layout design 171 have different first indicators (i.e., [4] and [2], respectively) and the same second indicator (i.e., [1]). Moreover, the dummy 161 and the layout design 171 overlap each other, wherein the overlap includes a short circuit point P7, which is a layout error. Therefore, the short circuit point P7 is displayed on a display for the user to eliminate the short circuit error.

Figure 14:
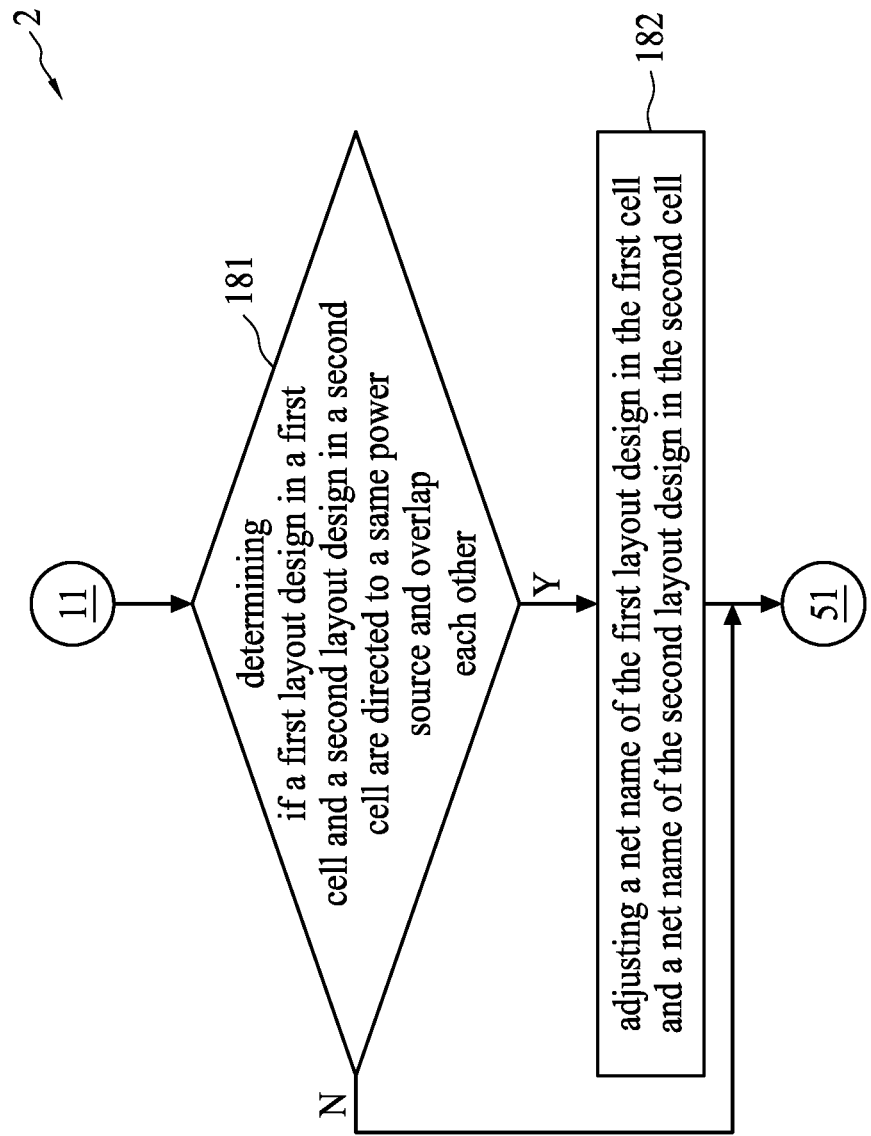
FIG. 14 is a flowchart illustrating a method according to an embodiment of the present disclosure.

FIG. 14 is a flowchart illustrating a method 2 according to an embodiment of the present disclosure. Provided that the results are substantially the same, the operations shown in FIG. 14 are is not required to be executed in the exact order. In this embodiment, the method 2 can be regarded as a part of the operation 12, and is executed after the operation 11 and before the operation 51. The method 2 is summarized as follows.

Operation 181: it is determined if a first layout design in a first cell and a second layout design in a second cell are directed to a same power source and overlap each other, if affirmative, go to operation 182; otherwise, the flow proceeds on the operation 51.

Operation 182: a net name of the first layout design in the first cell and a net name of the second layout design in the second cell are adjusted.

Figure 15A:
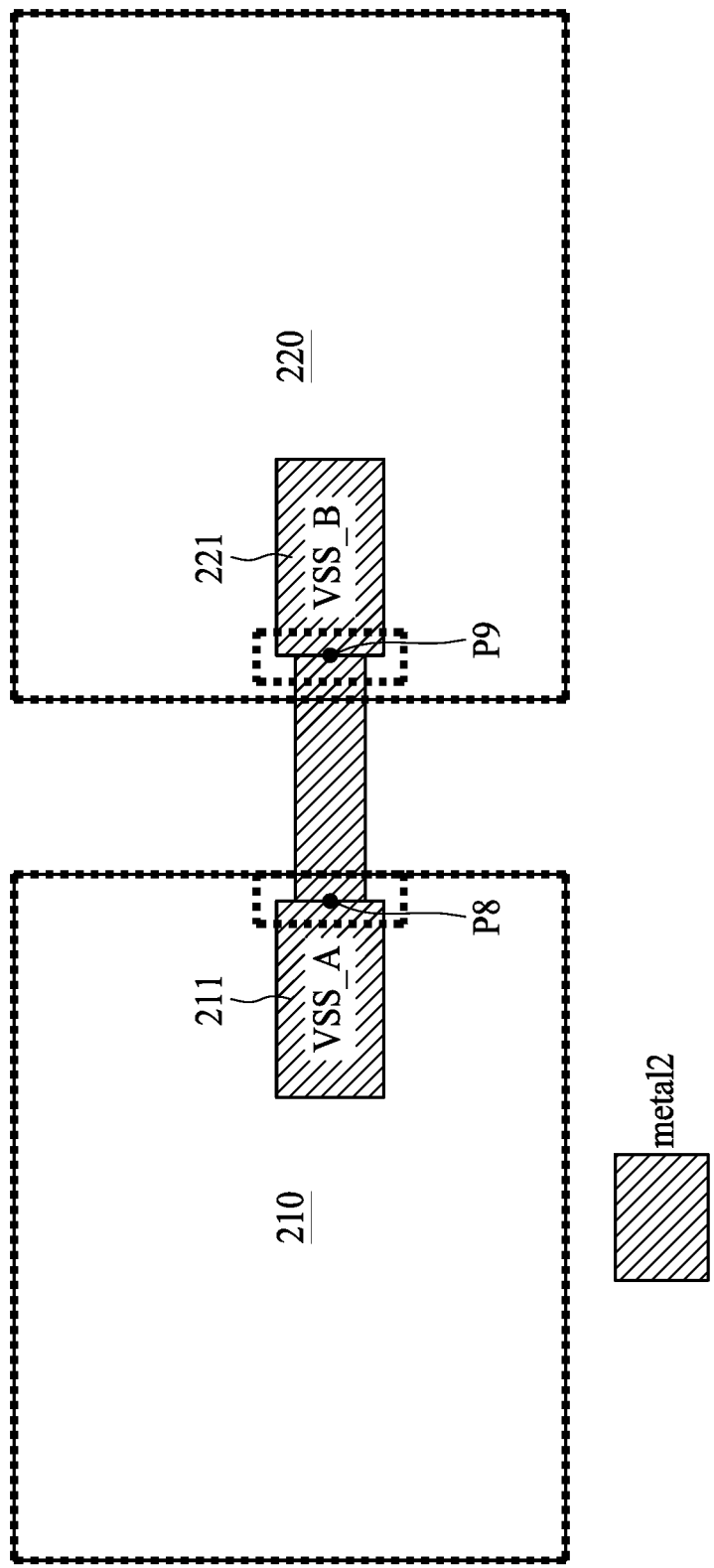
FIG. 15A is a diagram illustrating a cell and another cell according to an embodiment of the present disclosure.
Figure 15B:
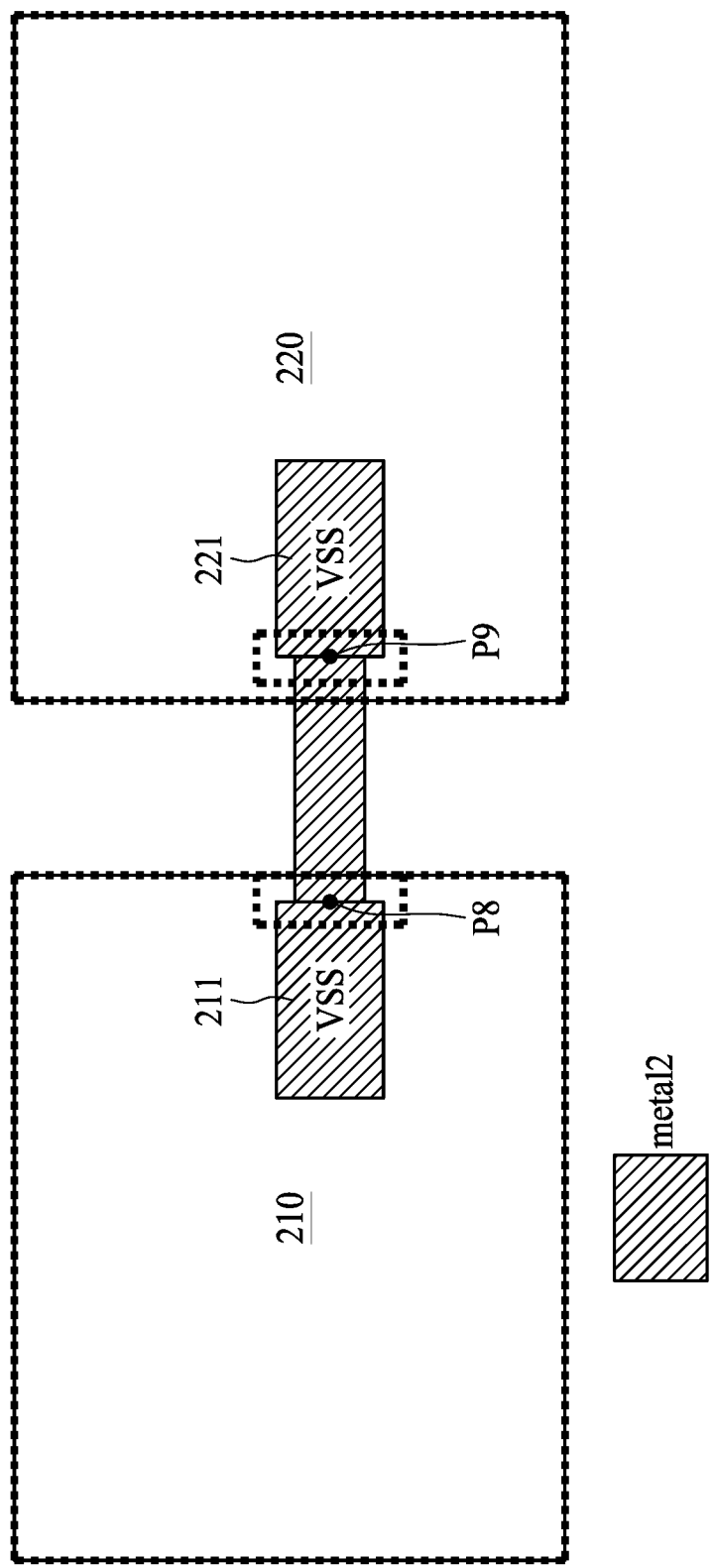
FIG. 15B is a diagram illustrating the cell and the another cell shown in FIG. 15A according to an embodiment of the present disclosure.

To elaborate the operations 181 to 182, please refer to FIGS. 15A and 15B. As shown in FIG. 15A, a layout pattern of a cell 210 includes a layout design 211. Further, a layout pattern of a cell 220 includes a layout design 221. The layout design 211 corresponds to a net name VSS_A and the layout design 221 corresponds to a net name VSS_B. The layout designs 211 and 221 are directed to a same power source, and overlap each other via a connective routing. The overlap includes points P8 and P9. Therefore, according to the embodiment of FIG. 14, the net name VSS_A of the layout design 211 and the net name VSS_B of the layout design 221 are adjusted to a net name VSS as shown in FIG. 15B.

Figure 16:
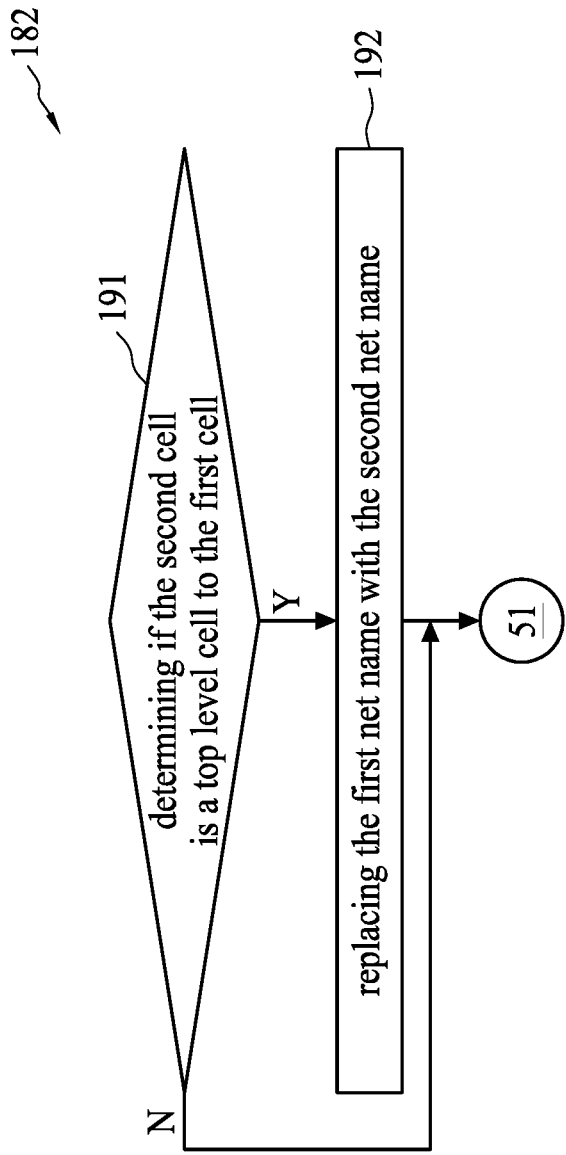
FIG. 16 is a flowchart illustrating an operation shown in FIG. 14 according to an embodiment of the present disclosure.

FIG. 16 is a flowchart illustrating the operation 182 according to an embodiment of the present disclosure. Provided that the results are substantially the same, the operations shown in FIG. 16 are is not required to be executed in the exact order. The operation 182 is summarized as follows.

Operation 191: it is determined if the second cell is a top level cell to the first cell, if yes, go to operation 192; otherwise, the flow proceeds on the operation 51.

Operation 192: the first net name is replaced with the second net name.

Figure 17A:
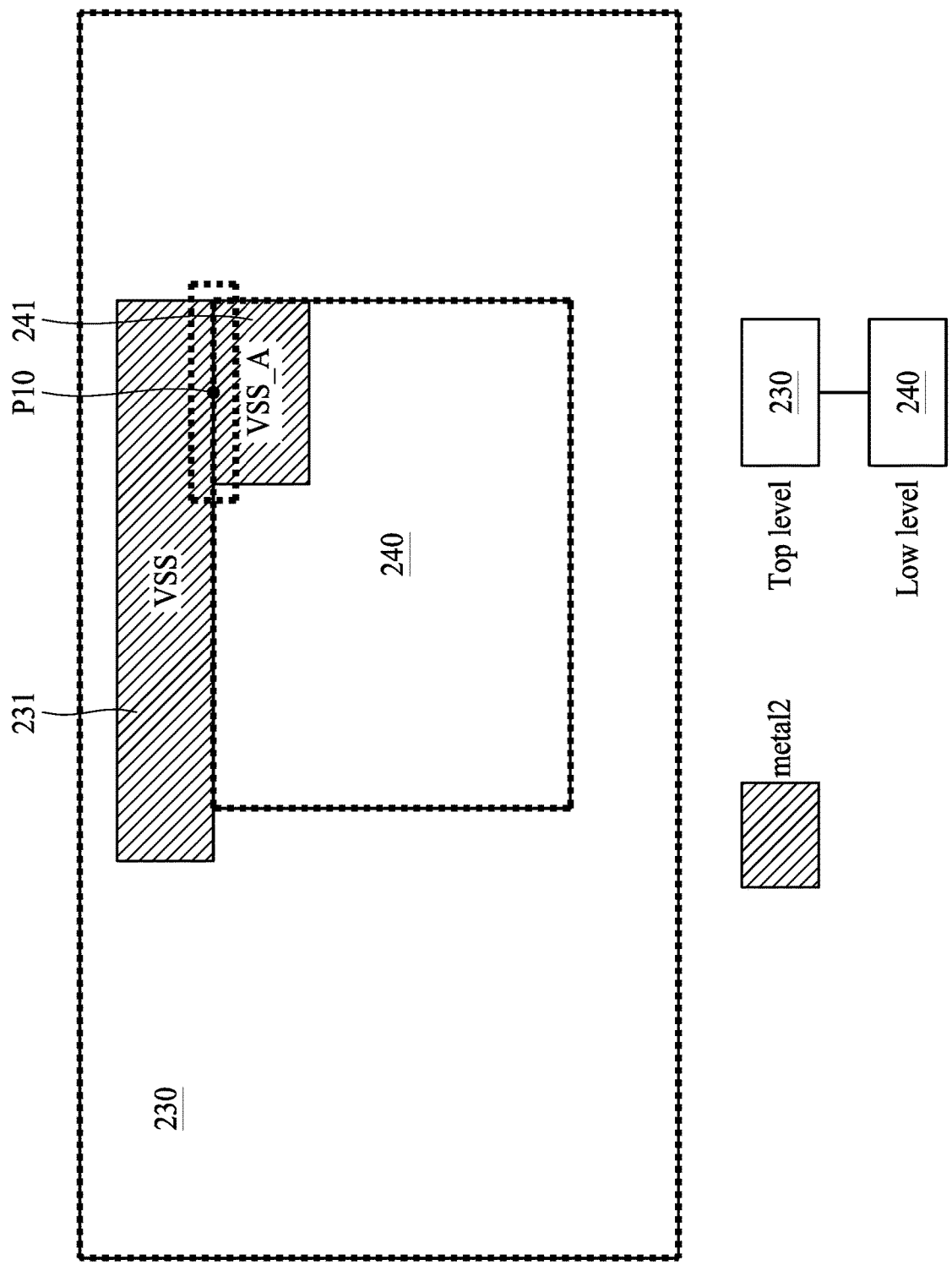
FIG. 17A is a diagram illustrating a cell according to an embodiment of the present disclosure.
Figure 17B:
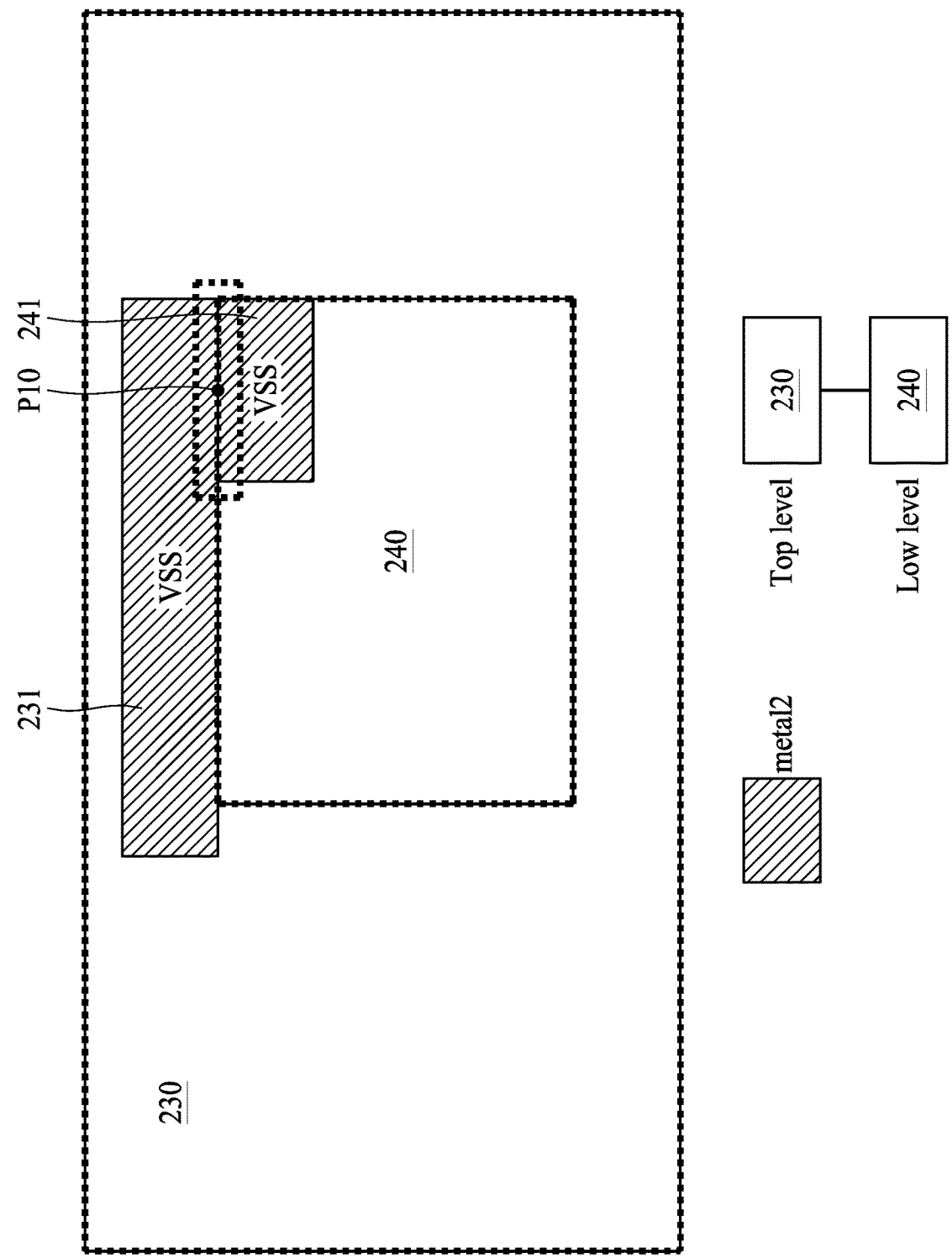
FIG. 17B is a diagram illustrating the cell shown in FIG. 17A according to an embodiment of the present disclosure.

To elaborate the operations 191 to 192, please refer to FIGS. 17A to 17B. In FIG. 17A, a cell 230 includes a cell 240, that is, the cell 230 is a top-level cell to a cell 240. The layout pattern of the cell 230 includes a layout design 231 corresponding to a net name VSS, and the layout pattern of the cell 240 includes a layout design 241 corresponding to a net name VSS_A. The layout design 231 and the layout design 241 overlap each other, wherein the overlap includes a point P10. Therefore, according to the embodiment of FIG. 16, the net name VSS_A of the layout design 241 is replaced with the net name VSS of the layout design 231 as shown in FIG. 17B.

Figure 18:
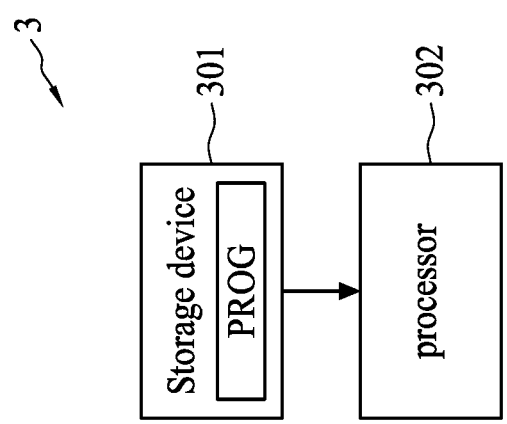
FIG. 18 is a diagram illustrating a system according to an embodiment of the present disclosure.

FIG. 18 is a diagram illustrating a system 3 according to an embodiment of the present disclosure. In this embodiment, the system 3 is a computer or any other device with computing power which should not be a limitation of the present disclosure. The system 3 includes a storage device 301 and a processor 302. The storage device 301 is arranged to store a program code PROG. When loaded and executed by the processor 302, the program code PROG instructs the processor 302 to execute the following operations: extracting a design data, wherein the design data includes a net name and a connective layer name of each layout design in each cell; generating a layout pattern corresponding to the design data by assigning an ID to said each layout design, wherein the IC includes a first indicator indicative of the net name and a second indicator indicative of the connective layer name; and checking the layout pattern to locate an error of the layout pattern.

Those skilled in the art should readily understand the operation of the processor 302 after reading the embodiments of FIGS. 1 to 17B, the detailed description is omitted here for brevity.

Figure 19:
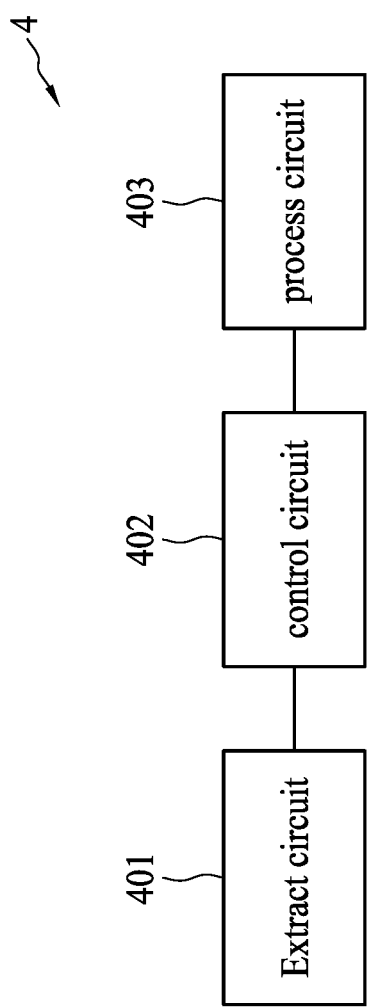
FIG. 19 is a diagram illustrating a system according to another embodiment of the present disclosure.

FIG. 19 is a diagram illustrating a system 4 according to an embodiment of the present disclosure. As shown in FIG. 4, the system 4 includes an extracting circuit 401, a control circuit 402 and a process circuit 403. In this embodiment, the system 4 is a computer or any other device with computing power which should not be a limitation of the present disclosure. In addition, the extract circuit 401, the control circuit 02 and the process circuit 403 can be implemented by software, hardware or firmware. The implementation of the extracting circuit 401, the control circuit 02 and the process circuit 403 is not a limitation of the present disclosure.

The extract circuit 401 is arranged to extract a design data, wherein the design data includes a net name and a connective layer name of each layout design in each cell. The control circuit 402 is arranged to generate a layout pattern corresponding to the design data by assigning an ID to said each layout design, wherein the ID includes a first indicator indicative of the net name and a second indicator indicative of the connective layer name. The process circuit 403 is arranged to check the layout pattern to locate an error of the layout pattern. Those skilled in the art should readily understand the operations of the extract circuit 401, the control circuit 02 and the process circuit 403 after reading the embodiments of FIGS. 1 to 17B, the detailed description is omitted here for brevity.

In some embodiments, a method is disclosed. The method includes extracting a design data using a computer, wherein the design data includes a net name and a connective layer name of each layout design in each cell; generating a layout pattern corresponding to the design data by assigning an ID to said each layout design, wherein the ID includes a first indicator indicative of the net name and a second indicator indicative of the connective layer name; and checking the layout pattern to locate an error of the layout pattern.

In some embodiments, a system is disclosed. The system includes a storage device and a processor. The storage device is arranged to store a program code. When loaded and executed by the processor, the program code instructs the processor to execute following operations: extracting a design data, wherein the design data includes a net name and a connective layer name of each layout design in each cell; generating a layout pattern corresponding to the design data by assigning an ID to said each layout design, wherein the IC includes a first indicator indicative of the net name and a second indicator indicative of the connective layer name; and checking the layout pattern to locate an error of the layout pattern.

In some embodiments, a system is disclosed. The system includes an extract circuit, a control circuit and a process circuit. The extract circuit is arranged to extract a design data, wherein the design data includes a net name and a connective layer name of each layout design in each cell. The control circuit is arranged to generate a layout pattern corresponding to the design data by assigning an ID to said each layout design, wherein the ID includes a first indicator indicative of the net name and a second indicator indicative of the connective layer name. The process circuit is arranged to check the layout pattern to locate an error of the layout pattern.

What is claimed is:

1. A method, comprising:
    extracting a design data using a computer, wherein the design data includes a net name and a connective layer name of each layout design in each cell;
    generating a layout pattern corresponding to the design data by assigning an ID to said each layout design, wherein the ID includes a first indicator indicative of the net name and a second indicator indicative of the connective layer name; and
    checking the layout pattern to locate an error of the layout pattern, wherein checking the layout pattern to locate the error of the layout pattern comprises:
    determining if IDs of two layout designs indicate that said two layout designs have different first indicators and same second indicator, and overlap each other at a short circuit point.

2. The method of claim 1, wherein assigning the ID to said each layout design comprises:
    determining if a first net name of a first layout design and a second net name of a second layout design are directed to a same power source; and
    assigning a same first indicator to the first and the second net names when the first and second net names are directed to the same power source.

3. The method of claim 2, wherein checking the layout pattern to locate the error of the layout pattern further comprises:
displaying the short circuit point on the layout pattern on a display when the IDs of said two layout designs indicate that said two layout designs have different first indicators and the same second indicator, and overlap each other at the short circuit point.

4. The method of claim 3, wherein checking the layout pattern to locate the error of the layout pattern further comprises:
displaying net names and a conductive layer name of said two layout designs overlapping each other at the short circuit point on the display when the IDs of two layout designs indicate that said two layout designs have different first indicators and the same second indicator, and overlap each other at the short circuit point.

5. The method of claim 2, wherein assigning the ID to said each layout design comprises:
generating a first mapping table for converting net names of layout designs to first indicators;
generating a second mapping table for converting connective layer names of the layout designs to second indicators; and
generating the ID of said each layout design according to the first mapping table and the second mapping table.

6. The method of claim 1, further comprising:
determining if a first layout design in a first cell and a second layout design in a second cell are directed to a same power source and overlap each other;
adjusting a net name of the first layout design in the first cell and a net name of the second layout design in the second cell when the first layout design and the second layout design are directed to the same power source and overlap each other.

7. The method of claim 6, wherein adjusting the net name of the first layout design in the first cell and the net name of the second layout design in the second cell when the first layout design and the second layout design are directed to the same power source and overlap each other comprises:
determining if the second cell is a top level cell to the first cell; and
replacing the first net name with the second net name when the second cell is the top level cell to the first cell.

8. A system, comprising:
a storage device, arranged to store a program code;
a processor, when loaded and executed by the processor, the program code instructs the processor to execute following operations:
extracting a design data, wherein the design data includes a net name and a connective layer name of each layout design in each cell;
generating a layout pattern corresponding to the design data by assigning an ID to said each layout design, wherein the IC includes a first indicator indicative of the net name and a second indicator indicative of the connective layer name; and
checking the layout pattern to locate an error of the layout pattern, wherein checking the layout pattern to locate the error of the layout pattern comprises:
determining if IDs of two layout designs indicate that said two layout designs have different first indicators and same second indicator, and overlap each other at a short circuit point.

9. The system of claim 8, wherein assigning the ID to said each layout design comprising:
determining if a first net name of a first layout design and a second net name of a second layout design are directed to a same power source; and
assigning a same first indicator to the first and the second net names when the first and second net names are directed to the same power source.

10. The system of claim 9, wherein checking the layout pattern to locate the error of the layout pattern further comprises:
displaying the short circuit point on the layout pattern on a display when the IDs of said two layout designs indicate that said two layout designs have different first indicators but same second indicator, and overlap each other at the short circuit point.

11. The system of claim 10, wherein checking the layout pattern to locate the error of the layout pattern further comprises:
displaying net names and a conductive layer name of said two layout designs overlapping each other at the short circuit point on the display when the IDs of said two layout designs indicate that said two layout design have different first indicators and same second indicator, and overlap each other at the short circuit point.

12. The system of claim 9, wherein assigning the ID to said each layout design comprises:
generating a first mapping table for converting net names of layout designs to first indicators;
generating a second mapping table for converting connective layer names of the layout designs to second indicators; and
generating the ID of said each layout design according to the first mapping table and the second mapping table.

13. The system of claim 8, wherein the program code further instructs the processor to execute following operations:
determining if a first layout design in a first cell and a second layout design in a second cell are directed to a same power source and overlap each other; and
adjusting a net name of the first layout design in the first cell and a net name of the second layout design in the second cell when the first layout design and the second layout design are directed to the same power source and overlap each other.

14. The system of claim 13, wherein adjusting the net name of the first layout design in the first cell and the net name of the second layout design in the second cell when the first layout design and the second layout design are directed to the same power source and overlap each other comprises:
determining if the second cell is a top level cell to the first cell; and
replacing the first net name with the second net name when the second cell is the top level cell to the first cell.

15. A system, comprising:
an extract circuit, arranged to extract a design data, wherein the design data includes a net name and a connective layer name of each layout design in each cell;
a control circuit, arranged to generate a layout pattern corresponding to the design data by assigning an ID to said each layout design, wherein the ID includes a first indicator indicative of the net name and a second indicator indicative of the connective layer name; and
a process circuit, arranged to check the layout pattern to locate an error of the layout pattern;
wherein the control circuit is further arranged to determine if a first net name of a first layout design and a second net name of a second layout design are directed to a same power source, and assign a same first indicator to the first and the second net names when the first and second net names are directed to the same power source;

wherein the process circuit is further arranged to determine if IDs of two layout designs indicate that said two layout design have different first indicators and same second indicator, and overlap each other at a short circuit point; and display the short circuit point on the layout pattern on a display when IDs of said two layout designs indicate that said two layout designs have different first indicators and same second indicator, and overlap each other at the short circuit point.

16. The system of claim 15, wherein the process circuit is further arranged to display net names and a conductive layer name of said two layout designs overlapping each other at the short circuit point on the display.

17. The system of claim 15, wherein the control circuit is further arranged to generate a first mapping table for converting net names of layout designs to first indicators, generate a second mapping table for converting connective layer names of the layout designs to second indicators, and the ID of said each layout design is generated according to the first mapping table and the second mapping table.

18. The system of claim 15, wherein the control circuit is further arranged to determine if a first layout design in a first cell and a second layout design in a second cell are directed to a same power source and overlap each other, and adjust a net name of the first layout design in the first cell and a net name of the second layout design in the second cell when the first layout design and the second layout design are directed to the same power source and overlap each other.

19. The systems of claim 18, wherein the control circuit is further arranged to determine if the second cell is a top level cell to the first cell, and replace the first net name with the second net name when the second cell is the top level cell to the first cell.

20. The system of claim 15, wherein the control circuit is further arranged to assign different first indicators to the first and the second net names when the first and second net names are directed to different power sources.

\* \* \* \* \*